United States Patent
Zhao et al.

(10) Patent No.: US 11,128,310 B1
(45) Date of Patent: Sep. 21, 2021

(54) BACKGROUND DUTY CYCLE ERROR MEASUREMENT FOR RF DAC

(71) Applicant: Analog Devices International Unlimited Company, Limerick (IE)

(72) Inventors: Jialin Zhao, Beijing (CN); Hajime Shibata, Toronto (CA); Gil Engel, Lexington, MA (US); Yunzhi Dong, Weehawken, NJ (US)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 0 days.

(21) Appl. No.: 16/888,750

(22) Filed: May 31, 2020

(30) Foreign Application Priority Data

Apr. 24, 2020 (WO) ................ PCT/CN2020/086732

(51) Int. Cl.
*H03M 1/10* (2006.01)
(52) U.S. Cl.
CPC ................ *H03M 1/1071* (2013.01)
(58) Field of Classification Search
CPC ...... H03M 1/1071; H03M 7/165; H03M 1/66; H03M 1/10; H03M 1/1009; H03M 1/06; H03M 1/1023
USPC .......................................... 341/144, 118, 120
See application file for complete search history.

(56) References Cited

U.S. PATENT DOCUMENTS

| | | | | |
|---|---|---|---|---|
| 6,081,218 A | * | 6/2000 | Ju ..................... | H03M 1/0682 341/143 |
| 8,144,043 B2 | * | 3/2012 | Risbo ................. | H03M 7/3006 341/144 |
| 8,581,760 B2 | * | 11/2013 | Muhammad ........ | H03M 1/201 341/118 |
| 9,203,426 B2 | | 12/2015 | Zhao et al. | |
| 9,337,854 B1 | | 5/2016 | Chen | |
| 9,577,657 B1 | * | 2/2017 | Clara .................. | H03M 1/109 |
| 9,735,797 B2 | | 8/2017 | Zhao et al. | |
| 9,838,031 B2 | * | 12/2017 | Dong .................. | H03M 3/436 |
| 1,006,950 A1 | | 9/2018 | Poulton et al. | |
| 10,693,483 B1 | * | 6/2020 | Luo ..................... | H03M 1/687 |
| 10,965,302 B1 | | 3/2021 | Zhao et al. | |

(Continued)

OTHER PUBLICATIONS

U.S. Office Action issued in U.S. Appl. No. 16/709,899 dated Aug. 6, 2020, 7 pages.

(Continued)

*Primary Examiner* — Jean B Jeanglaude
(74) *Attorney, Agent, or Firm* — Patent Capital Group

(57) ABSTRACT

Digital to analog conversion generates an analog output corresponding to a digital input by controlling unit elements or cells using data bits of the digital input. The unit elements or cells individually make a contribution to the analog output. Due to process, voltage, and temperature variations, the unit elements or cells may have mismatches and/or errors. The mismatches and/or errors can degrade the quality of the analog output. To extract the mismatches and/or errors, a transparent dither can be used. The mismatches and/or errors can be extracted by observing the analog output, and performing a cross-correlation of the observed output with a switching bit stream of the dither. Once extracted, the unit elements or cells can be adjusted accordingly to reduce the respective mismatches and/or errors.

39 Claims, 15 Drawing Sheets

(56) References Cited

U.S. PATENT DOCUMENTS

| | | | |
|---|---|---|---|
| 2011/0267210 A1* | 11/2011 | Risbo | H03M 7/3006 |
| | | | 341/110 |
| 2013/0082853 A1* | 4/2013 | Muhammad | H03M 1/201 |
| | | | 341/118 |
| 2017/0179975 A1* | 6/2017 | Dong | H03M 3/388 |
| 2019/0173479 A1* | 6/2019 | Dyachenko | H03M 1/0641 |
| 2019/0280706 A1 | 9/2019 | Bodnar et al. | |
| 2020/0162088 A1 | 5/2020 | Eielsen et al. | |

OTHER PUBLICATIONS

Witte et al., Background DAC Error Estimation Using a Pseudo Random Noise Based Correlation Technique for Sigma-Delta Analog-to-Digital Converters, IEEE Transactions on Circuits and Systems-I: Regular Papers, vol. 57, No. 7, Jul. 2010, 13 pages.

Taylor et al., A Mostly-Digital Variable-Rate Continuous-Time Delta-Sigma Modulator ADC, IEEE Journal of Solid-State Circuits, vol. 45, No. 12, Dec. 2010, 13 pages.

Dong et al., Adaptive Digital Noise-Cancellation Filtering Using Cross-Correlators for Continuous-Time MASH ADC in 28nm CMOS, 978-1-5090-5191-5 © 2017 IEEE, 4 pages.

Tang et al., A 14 bit 200 MS/s DAC with SFDR >78 dBc, IM3 <−83 dBc and NSD <−163 dBm/Hz *Across the Whole Nyquist Band Enabled by Dynamic-Mismatch Mapping*, IEEE Journal of Solid-State Circuits, vol. 46, No. 6, Jun. 2011, 11 pages.

He et al., a 50MHz-BW *Continuous-Time ΔΣ ADC with Dynamic Error Correction Achieving 79.8dB SNDR and 95.2dB SFDR*, ISSCC 2018, Session 14, High-Resolution ADCs, 14.1, 2018 IEEE International Solid-State Circuits Conference, 3 pages.

Non-Final Office Action dated Nov. 27, 2020 in U.S. Appl. No. 16/783,089, 11 pages.

\* cited by examiner

BACKGROUND DUTY CYCLE ERROR MEASUREMENT FOR RF DAC

PRIORITY DATA

The present application claims priority to International Patent Application PCT/CN2019/086732 filed on 24 Apr. 2020, entitled "BACKGROUND DUTY CYCLE ERROR MEASUREMENT FOR RF DAC", which is incorporated by its entirety herein.

TECHNICAL FIELD OF THE DISCLOSURE

The present disclosure relates generally to digital to analog converters (DACs) and, more particularly but not limited to, to background measurement of duty cycle error for radio frequency (RF) DACs.

BACKGROUND

DACs are used in a variety of applications to convert a digital signal into an analog signal. For example, a processor can generate a digital signal, and a DAC can convert the digital signal into an analog signal suitable for transmission over a wired or wireless medium. A DAC can be characterized by, e.g., resolution, speed/sampling rate, bandwidth, dynamic range, amount of harmonic distortion or noise, power consumption, area/size, etc.

Design of a DAC can vary depending on the target specifications. Some DACs are designed for precision, while some DACs are designed for speed. All DACs would include DAC cells, which are controllable by a data bits of a digital input and contribute to an analog output. For instance, a DAC cell can be controlled to provide a certain amount of charge to the analog output. In aggregate, the DAC cells can be operable to output an analog output that corresponds with the digital input to the DAC.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Figure 1:
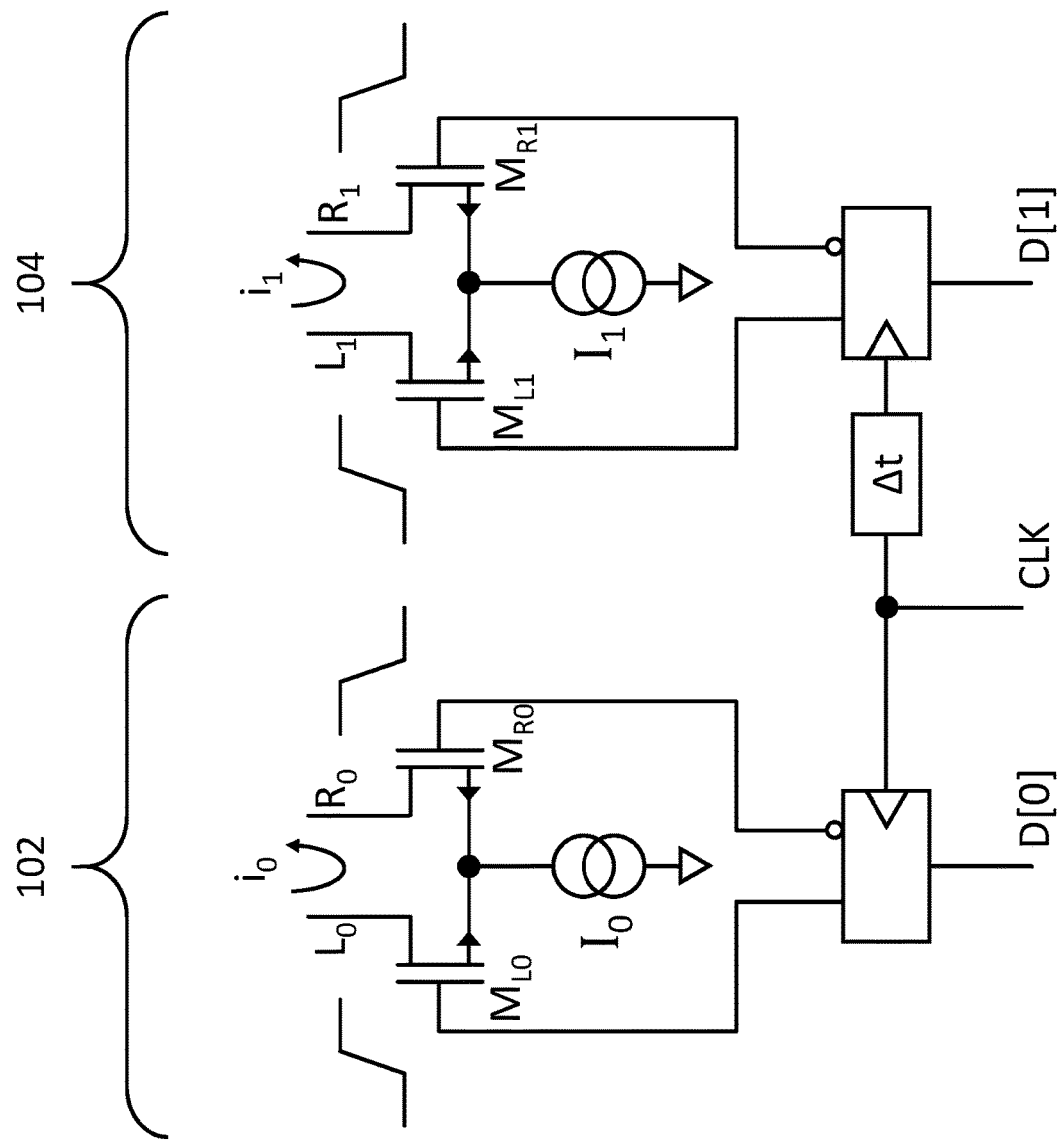
FIG. 1 shows two exemplary DAC cells, according to some embodiments of the disclosure.

Digital to analog conversion generates an analog output corresponding to a digital input by controlling DAC cells using data bits of the digital input. The DAC cells individually make a contribution to the analog output. Due to process, voltage, and temperature variations, the DAC cells may have mismatches. The mismatches can degrade the quality of the analog output. To extract the mismatches, a transparent dither can be used. The mismatches can be extracted by observing the analog output, and performing a cross-correlation of the observed output with the dither. Once extracted, the DAC cells can be adjusted accordingly to reduce the mismatches.

DAC Architectures

DACs can be implemented in a variety of architectures. In some cases, a DAC can include a string of resistors and switches controllable by data bits of a digital input to configure the string of resistors and output different voltages at the analog output. In some cases, a DAC can include an R-2R resistor ladder and switches controllable by data bits of a digital input to configure the R-2R resistor ladder and output different voltages at the analog output. In some cases, a DAC can include current sources that are individually controllable by data bits of a digital input to steer current towards or away from the output of the DAC and output different amounts of current at the analog output In some cases, a DAC can include a bank of capacitors and switches controllable by data bits of a digital input to connect the plates of the capacitors to voltage references to implement charge redistribution and output different voltages at the analog output.

Regardless of the architecture, a DAC generally has individual elements, referred to as DAC cells herein, that are sized to make contributions of certain weights to an analog output of a DAC. DAC cells can be binary coded (e.g., where DAC cells are weighted according to $2^N$). DAC cells can be thermometer coded (e.g., where DAC cells have the same weight or unit weight).

A DAC can include a segmented design, where parts of a DAC is implemented using different architectures and/or weighing schemes. For instance, one part of the data bits of the digital input can control a DAC implemented in a first architecture and the DAC cells are binary coded, and another part of the data bits of the digital input can control a DAC implemented in a second, different architecture and the DAC cells are thermometer coded. In one example, a DAC is segmented as a X-Y-Z segmented DAC. The X-Y-Z segmented DAC has a section for X most significant bits (MSBs), a section for Y intermediate significant bits (ISBs), and a section for Z least significant bits (LSBs). The MSB and ISB sections can be thermometer coded while the LSB section is binary coded. The sections can be implemented using different DAC architectures (e.g., resister string, R-2R, current steering, and capacitive DAC architectures).

What are the Mismatches of DAC Cells, and why Mismatches Matter

Due to process, temperature, and/or voltage variations, the weights of the DAC cells may not be exactly at their ideal weights. For instance, a group of DAC cells may not be exactly binary coded. For a group of DAC cells that are thermometer coded, the weights of the DAC cells may not be exactly the same as each other. Such mismatches in the weights of the DAC cells can cause DAC cells to have static errors. Also, due to process, temperature, and/or voltage variations, the switches of the DAC cells not all operate with the same timing. Such mismatches in the timing of switches can cause DAC cells to have timing skew errors and duty cycle errors.

FIG. 1 shows two exemplary DAC cells, according to some embodiments of the disclosure. For illustration, the DAC cells are current steering DAC cells. One skilled in the art would appreciate that other types of DAC cells (e.g., comprising resistors, or capacitors) would also have the same and/or similar errors associated with mismatches. Mismatches can be associated with non-ideal weights, timing skew differences, and duty cycle differences. FIG. 1 shows two current steering DAC cells, current steering DAC cell 102 and current steering DAC cell 104 having mismatches, according to some embodiments of the disclosure. Process, voltage, and/or temperature variations can cause mismatches.

A current steering DAC cell has a current source (denoted as $I_0$ for DAC cell 102 and as $I_1$ for DAC cell 104) and may have two switches (shown as transistors $M_{L0}$ and $M_{R0}$ for DAC cell 102, and transistors $M_{L1}$ and $M_{R1}$ for DAC cell 104) coupled to the current source for steering the current. The two switches form a differential pair to generate differential current outputs. The switches are controlled by a data bit D[k] of the digital input corresponding to the DAC cell to steer the current. Switches of the DAC cell 102 is controlled by, e.g., data bit D[0], and switches of the DAC cell 104 are controlled by, e.g., data bit D[1]. The data bit for a given DAC cell can control whether the current is steered towards the one of the differential current outputs (denoted as $L_0$ for DAC cell 102, and $L_1$ for DAC cell 104) or the other one of the different current outputs (denoted as $R_0$ for DAC cell 102, and $R_1$ for DAC cell 104) of the given DAC cell. Current output of the current steering DAC cell 102 is represented by $i_0$. Current output of the current steering DAC cell 104 is represented by $i_1$. The circuit in the current steering DAC cell ensures that exactly one of the two switches turns on to steer the current based on the data bit (e.g., D[0] and D[1]). The turning on of the switches is clocked by clock signal CLK, which is provided to each DAC cell.

Static errors are caused by DAC cells having non-ideal weights. For current steering DAC cells, the non-ideal weights can be caused by the current sources providing non-ideal amounts of current that do not match the ideal weights of the DAC cells. In some cases, static errors are called DC (direct current) errors. Static errors tend to show up and dominate at low frequencies.

Timing skew errors are caused by the timing skew difference among DAC cells. The timing skew Δt between two current steering DAC cells, can be introduced by clock path mismatches and asymmetries, i.e., the CLK signal experiences different latencies as they arrive at the DAC cells. As a result, the charge or current being delivered to the respective outputs of the DAC cells, shown as $i_0$ and $i_1$ for DAC cells 102 and 104 respectively, are mismatched due to the timing skew of the clock signal CLK arriving at the DAC cells. As the speed of the DAC increases (e.g., for RF applications, the DAC operate at giga-samples per second), timing skew errors can be more present. In other words, timing skew errors can be significant at higher frequencies. Timing skew errors can be considered a type of dynamic error.

Duty cycle errors are caused by the mismatches in the transistors among the DAC cells. As a result, the charge or current being delivered to the respective outputs of the DAC cells at different switching instances, shown as $i_0$ and $i_1$ for DAC cells 102 and 104 respectively, are mismatched due to the mismatches in the transistors. As the speed of the DAC increases (e.g., for RF applications, the DAC operate at giga-samples per second), duty cycle errors can be more present. In other words, duty cycle errors can be significant at higher frequencies. Duty cycle errors can be considered a type of dynamic error.

Figure 2:
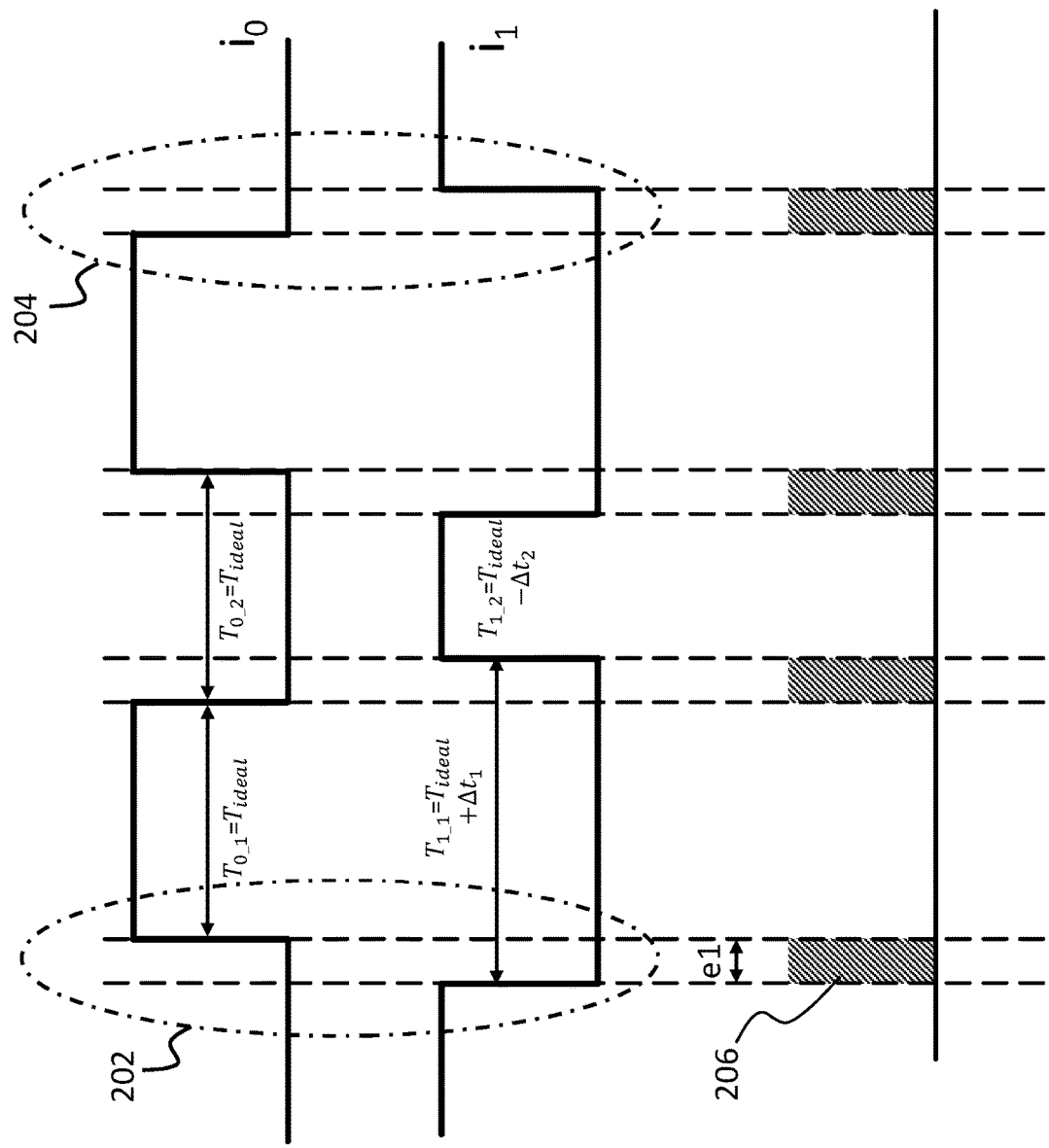
FIG. 2 shows current waveforms of the two exemplary DAC cells of FIG. 1, according to some embodiments of the disclosure.

FIG. 2 shows current waveforms, $i_0$ and $i_1$, of the two exemplary DAC cells of FIG. 1, according to some embodiments of the disclosure. The two DAC cells 102 and 104 are driven by data bits of opposite polarity. Ideally, the current waveforms should be exactly the same but opposite of each other. However, mismatches may cause the current waveforms to not be the same. The current waveforms in FIG. 2 illustrate error charges delivered at the current outputs due to duty cycle mismatches or errors. Duty cycle mismatches between DAC cells can cause different amount of charges to be delivered over time, as illustrated by current waveforms, $i_0$ and $i_1$, for DAC cell 102 and DAC cell 104. For example, current waveform $i_0$ has ideal timing, and current waveform $i_1$ has non-ideal timing. It can be seen that the current waveforms $i_0$ and $i_1$ transition to different states at different times. In some instances, the current waveform $i_1$ transitions states before the current waveform $i_0$ transitions states (e.g., occurring in 202). In some instances, the current waveform $i_0$ transitions states before the current waveform $i_1$ transitions states (e.g., occurring in 204). When the two waveforms are summed, the duty cycle mismatch between DAC cells can cause error charges (e.g., 206) with width el at switching instances where the transitions of the current waveforms are not aligned in time. In other words, the error charges with the label el associated with duty cycle error appear when the DAC cells are not switching from one state to another state at the same time, or where the state transitions in the current waveforms are not aligned in time. As a result, over a period of time, one DAC cell can deliver more charge than another DAC cell. An error charge caused by duty cycle mismatch can be present at one or more of: the rising edge, and the falling edge, of the current waveform.

Static errors, timing skew errors, and duty cycle errors matter because the total delivered charge by the DAC, which has many DAC cells, would be signal dependent. In other words, static errors, timing skew errors, and duty cycle errors can cause signal dependent errors. Signal dependent errors can introduce harmonic distortions, and degrade the performance of the DAC. The timing skew errors and duty cycle errors, in particular, among DAC cells becomes more significant for high speed DACs, since the errors caused by timing skew and duty cycle mismatches can take up a bigger portion of the entire charge in one clock cycle as the clock gets faster. Due to these errors, the Signal-to-Noise-and-Distortion Ratio (SNDR) and spurious free dynamic range (SFDR) performances of the DAC can be greatly deteriorated. Therefore, for high speed DACs, the correction of the various mismatches among the DAC cells can play a significant role in achieving high linearity.

A Background Measurement Technique to Extract Duty Cycle Error

When DAC cells are exercised appropriately and the analog output of the DAC is observed, a background measurement technique can extract the duty cycle error of the DAC cells of a DAC from the analog output of the DAC (or a quantized output of the DAC). The measurement technique injects a transparent dither into the DAC, uses an observer analog to digital converter (ADC) to digitize the DAC analog output, and performs cross-correlation of a switching bit stream of the transparent dither and the quantized output of the DAC to extract the duty cycle error information. The error charges caused by the duty cycle error is strongly correlated to and occurs at switching instances of the dither signal. Accordingly, the $0^{th}$ or center tap of the cross-correlation of the switching bit stream and the digital output from the observer ADC can yield information on the duty cycle error.

A switching bit stream is a digital bit stream having values that represent switching activity, such as values that indicate the presence or absence of switching in a signal. For instance, a switching bit stream has a value of "1" when the dither signal transitions states (i.e., when there is a switching instance), and has a value of "0" when the dither signal maintains the same state (i.e., when there is no switching). One way to generate the switching bit stream is to apply an exclusive-or (XOR) operation on a current value of the dither signal with a previous value of the dither signal. A switching bit stream of the transparent dither is used for the cross-correlation because duty cycle error causes error charges to be delivered at switching instances or occurrences. Accordingly, a cross-correlation of the switching bit stream of the transparent dither and the quantized output of the DAC can expose the duty cycle error of a DAC cell.

Injecting a transparent dither means that a dither signal is injected and cancelled/removed. A dither signal can be a randomized bit stream (e.g., of 0's and 1's, or −1 and 1's). The randomized bit stream can be a pseudo-random sequence, such a pseudo-random binary sequence. The randomized bit stream can be generated by a pseudo-random number generator. The dither signal can be uncorrelated with the digital input of the DAC. The dither signal can be a narrow-band noise signal, e.g., a narrow-band noise signal outside of the frequency band of the digital input of the DAC. The dither signal can be a wide-band noise signal. The dither signal can have other suitable frequency responses and/or shapes of frequency responses. The dither signal can cause a transparent dither of various weights or values to be injected. Exemplary weights or values can include 0.5 LSB, 1 LSB, 1.5 LSB, 2 LSBs, etc. The extraction of duty cycle error would work irrespective of the weight or value of the dither signal.

Injecting the dither signal can be done in different ways. For example, a dither signal of certain weight can be injected in the digital domain (e.g., for a stand-alone DAC). In another example, a dither signal of a certain weight can be injected in the analog domain (e.g., where the DAC is downstream of an ADC). Note that the injected dither signal exercises a corresponding DAC cell in the DAC. For example, the injected dither signal can exercise an MSB DAC cell to inject one MSB. To cancel/remove the dither, a different DAC cell can be exercised using the same dither signal with opposite polarity to subtract out the injected dither signal in the analog domain. An additional/extra DAC cell can be added to the DAC for this purpose. For instance, an extra MSB DAC cell can be exercised to cancel the injected MSB. Exercising two DACs cells in this manner would yield a difference between the two DAC cells at the output of the DAC, because one DAC cell in the DAC is exercised with the dither signal, and the other DAC cell in the DAC is exercised with the same dither signal with opposite polarity. The difference between the two DAC cells would expose the duty cycle errors relative to each other, since the two DAC cells are effectively being compared against each other. The DAC cells can have the same weight. In some cases, the DAC cells can have (slightly) different weights.

The observer ADC downstream of the DAC be used to digitize the output of the DAC, which includes the difference between the two DAC cells. The observer ADC can be at the same speed as the DAC, but can at other speed as desired (e.g., slower speed as the DAC). The observer ADC can be a voltage-controlled-oscillator (VCO) ADC, or other types of ADCs. The digital output of the observer ADC (serving as data points) can be cross-correlated with a switching bit stream of the dither signal. Cross-correlation is a sliding dot product or sliding inner product of two series (i.e., the digital output of the observer ADC and the dither signal). The $0^{th}$ tap of the cross-correlation result the cross-correlation result can be used to extract the duty cycle error of the DAC cell under calibration.

An error charge is introduced at each switching instance/occurrence. Therefore, total amount of error charge caused by duty cycle error of a DAC cell under calibration is proportional to the number of switching instances or switching occurrences (e.g., more error charges are injected to the DAC output when there are more switching instances/occurrences) during the measurement. The duty cycle error duty cycle error extracted from a cross-correlation result for a given DAC cell can be adjusted or normalized based on a switching count of the dither signal, or the switching bit stream of the dither signal. A counter can count a number of switching instances in the switching bit stream or the dither signal to maintain a switching count for a given measurement.

The measurement scheme can be repeated for other DAC cells by selecting a different DAC cell to cancel out the injected dither signal. The cross-correlation results generated from selecting the other DAC cells to cancel out the injected dither signal can yield duty cycle errors of other DAC cells.

There may be a constant offset in duty cycle errors of the different DAC cells caused by the Direct Current (DC) offset in the measurement path. For example, a DC offset of the observer ADC can cause a constant offset in the measured duty cycle errors relative to the true duty cycle error. The constant offset in the measurements, caused by the DC offset in the measurement path, can be removed by measuring the duty cycle error twice, each time with different switching counts. Performing two measurements sets up two equations with two unknowns, for instance:

$$M_1 = DC + e^* c_1 \quad \text{(eq. 1)}$$

$$M_2 = DC + e^* c_2 \quad \text{(eq. 2)}$$

$M_1$ is the first measurement of the duty cycle error. $c_1$ represents a first switching count of the first measurement. $M_2$ is the second measurement of the duty cycle error. $c_2$ is a second switching count of the second measurement. The first switching count is not the same as the second switching count. $c_1 \neq c_2$. DC represents the constant offset caused by the DC offset in the measurement path. The constant offset is the same in both measurements. There is an assumption that the input signal condition are equal for the two measurements with different switching counts, so that the DC component from the input signal is the same, or that difference in the input signal condition for the two measurements are negligible. e represents the duty cycle error of the DAC cell. The duty cycle error is the same in both measurements, since the measurements are done on the same DAC cell. $M_1$, $M_2$, $c_1$, and $c_2$ are known. DC, and e are unknown, but can be determined from the two equations 1 and 2.

There are substantial merits of this measurement technique. The measurement technique is measuring the true DAC path duty cycle error, which can include duty cycle error in the DAC data path, duty cycle error in the DAC cells in the DAC core, and duty cycle in the output tree. For higher speed and wider bandwidth applications, duty cycle error in each part of the true DAC path make a significant contribution to the overall performance of a DAC. Therefore, the measurement technique is particularly suitable for such applications. When the duty cycle error can be compensated, the analog circuit design requirements, complexity, and size of the output tree can be reduced. As a result, the DAC output bandwidth and the output power at high frequencies can be increased. Moreover, since the technique can be used in the background, which means that dynamic errors, e.g., errors with voltage, temperature, and/or frequency dependence, can be measured and subsequently corrected or compensated. The background technique can track the temperature variation, therefore the need to implement two-factor calibration DAC is obviated and the DAC design save some area. Typically, a two-factor calibration DAC is implemented to track temperature variations and their impact on threshold voltage and mobility (i.e., current) of transistors. A two-factor calibration DAC can perform startup or foreground calibration to calibrate the DAC at room temperature, and utilizes additional circuitry to track temperature changes in the background. With this background measurement technique, the side effects of temperature variations (e.g., duty cycle error) can be extracted and compensated for. Therefore, the DAC circuitry can be simplified dramatically. Lastly, the measurement technique is flexible enough to be used to extract duty cycle error of DAC cells for a variety of DACs, including but not limited to: a stand-alone (high speed) DACs (i.e., the DAC is not being used as part of an analog to digital conversion), a DAC that generates an analog signal as part of an analog to digital conversion, a DAC inside a pipelined ADC, a DAC inside a successive-approximation-register ADC, a DAC inside a continuous-time delta sigma modulator, a DAC in a continuous-time pipelined ADC, and a DAC in a pipelined ADC having a continuous-time front end and a VCO ADC back end.

The measurement technique will add some area and power penalty. However, using a VCO ADC as the observer ADC can limit the added area and power penalty because a VCO ADC is highly/mostly digital, and its size shrinks as process becomes smaller. A rough estimate of the power consumption for digital processing circuitry for performing cross-correlation is 5 mW. Combined with the 25 mW from VCO ADC and other small digital blocks, the totally added power consumption is likely less than 40 mW.

Details, variations, and advantages of the above features are described in greater detail in the following passages.

An Exemplary DAC with Duty Cycle Error Measurement

Figure 3:
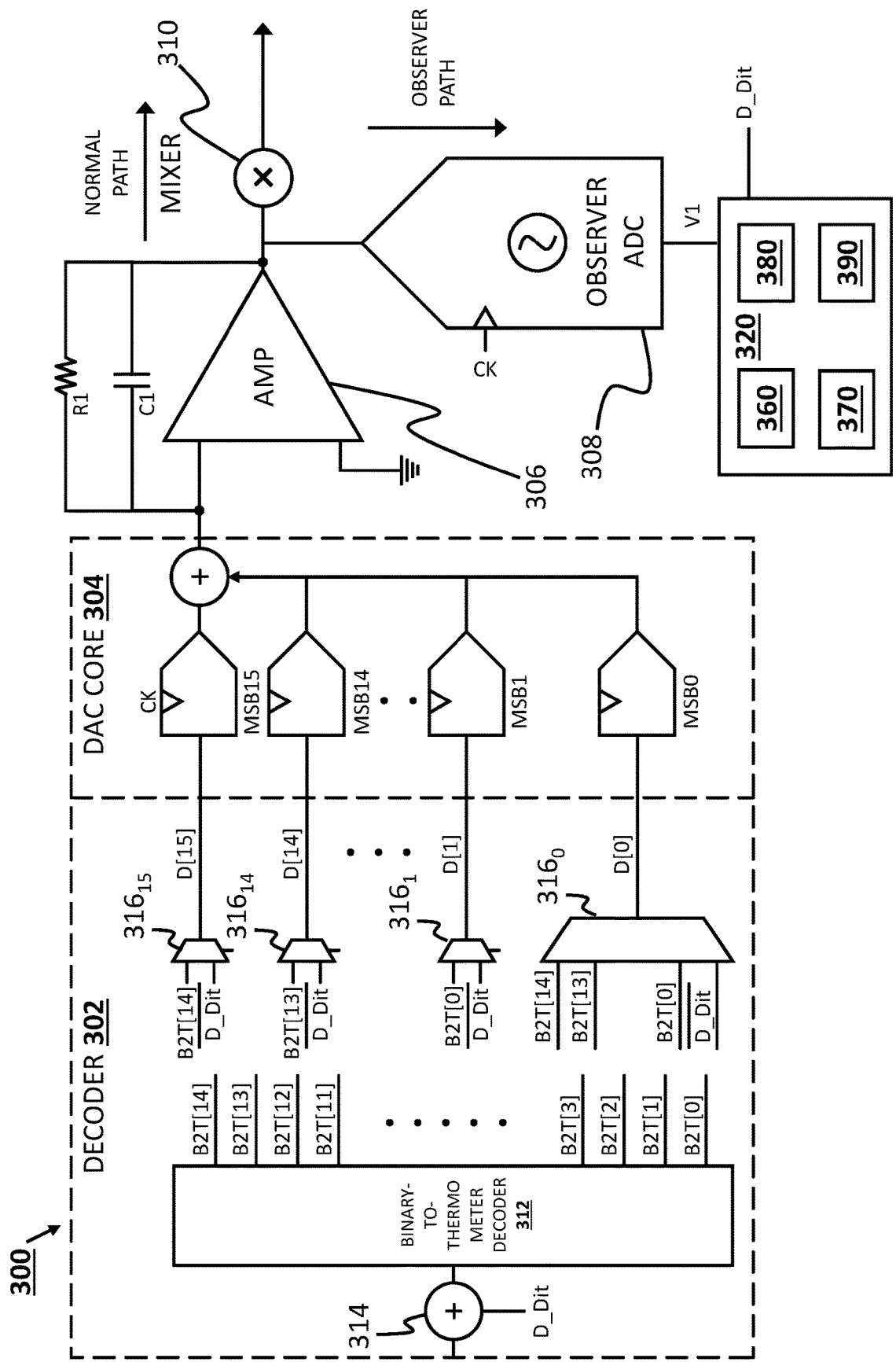
FIG. 3 shows an exemplary DAC with duty cycle error measurement, according to some embodiments of the disclosure.

FIG. 3 shows an exemplary DAC 300 with duty cycle error measurement, according to some embodiments of the disclosure. The exemplary DAC 300 with duty cycle error measurement includes a plurality of DAC cells forming a DAC core 304. The DAC 300 can include an amplifier 306 at the analog output of the DAC cells, and an observer ADC 308 can observe an output of the amplifier 306, and quantize the output of the amplifier 306 (i.e., an analog output of the DAC cells). In some cases, there is a mixer 310 at the output of the amplifier 306. The mixer 310 is in the normal path of the DAC output. The observer ADC 308 is in the observer path of the DAC output.

In some embodiments, the exemplary DAC 300 receives a digital input and a dither signal added thereto. The exemplary DAC 300 can include a decoder 302 to manipulate and generate data bits for the DAC core 304. Generally, the decoder 302 is optional, but can be included in DAC 300 to perform decoding of a digital input into data bits that control respective DAC cells in the DAC core 304. For instance, a decoder 302 can include a binary to thermometer decoder 312 for converting a binary digital input having the dither signal added thereto, into thermometer coded data bits. A decoder 302 can be included in a DAC to decode a digital input into data bits that are suitable for driving DAC cells of a segmented DAC. For instance, the decoder 302 can decode a portion of a binary digital input (e.g., MSBs and ISBs) into thermometer coded data bits to drive DAC cells with the same weights, and use a portion of the binary digital input (e.g., LSBs), without decoding, directly as binary coded data bits to drive DAC cells with binary weights. For simplicity, FIG. 3 shows a DAC 300 that receives a binary digital input and uses DAC cells in the DAC core 304 having the same weights (thermometer coded) to generate an analog output.

Although not shown explicitly in FIG. 3, the DAC 300 can be one part of a segmented DAC. Specifically, the MSB segment is shown. One skilled in the art would appreciate that the background measurement technique described herein are applicable for measuring errors of DAC cells in ISB or LSB segments, and for measuring errors of DAC cells in other types of DACs as well.

Figure 4:
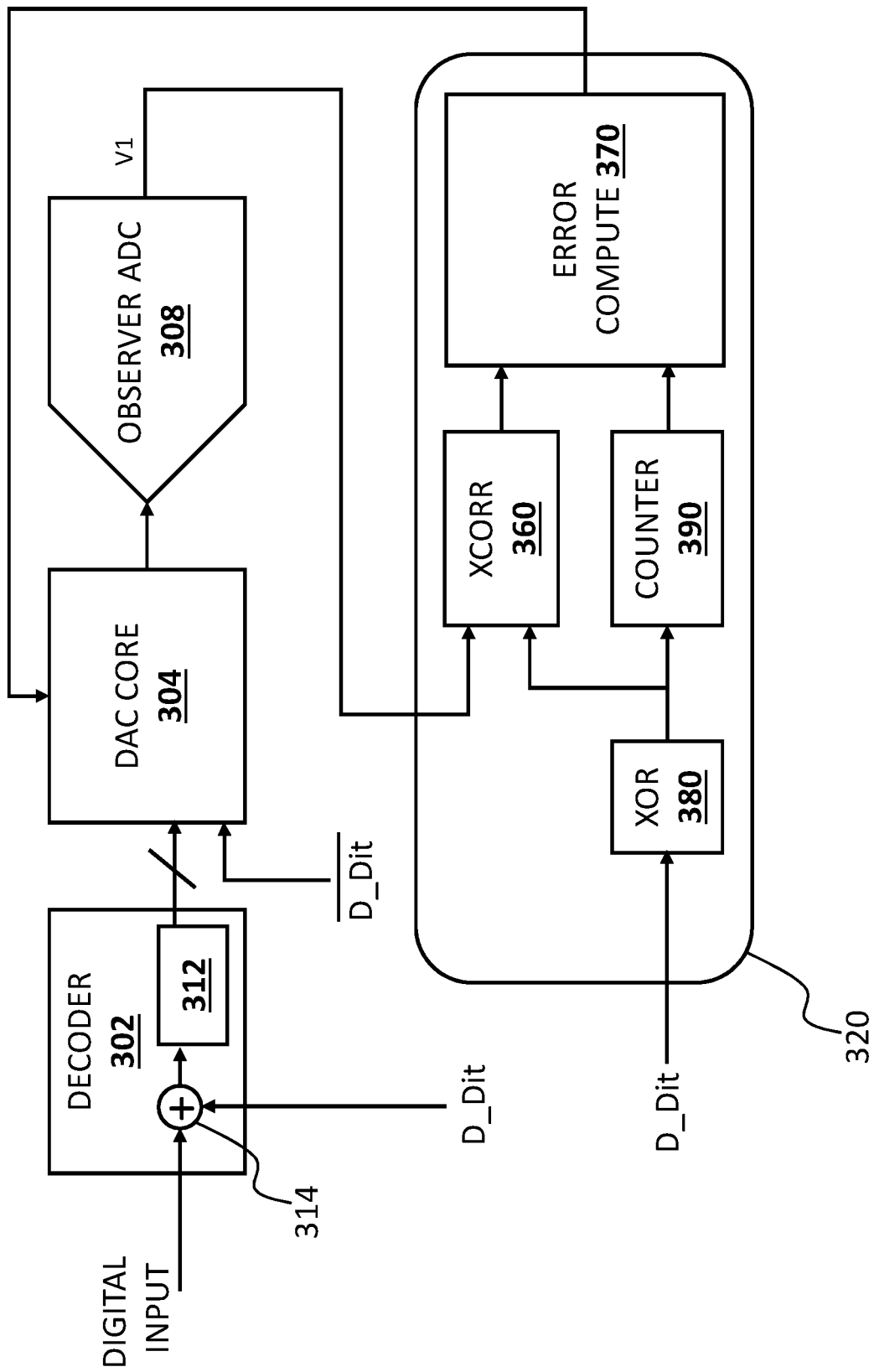
FIG. 4 shows a DAC with duty cycle error measurement, where the dither signal is added digitally, according to some embodiments of the disclosure.
Figure 5:
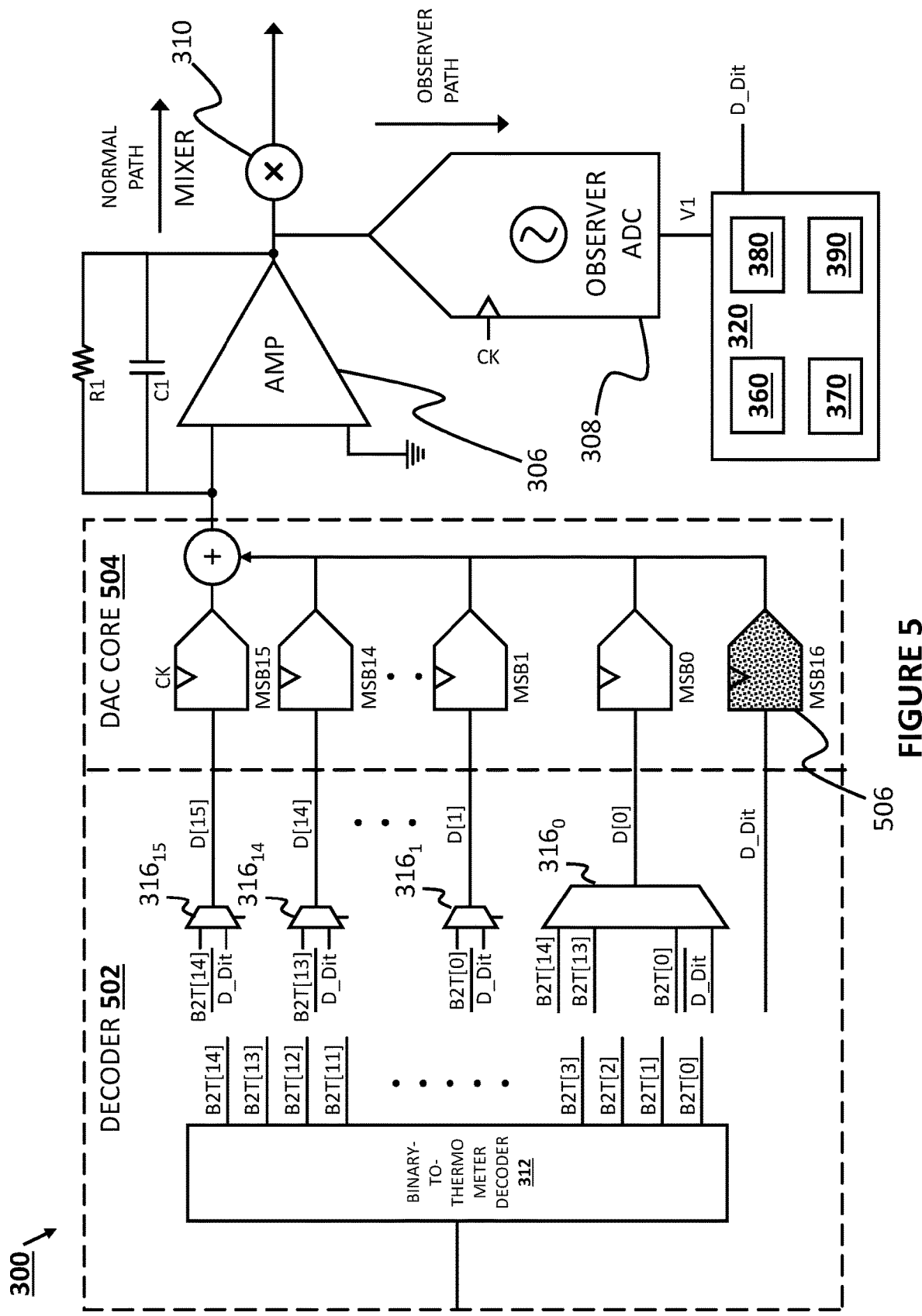
FIG. 5 shows another DAC with duty cycle error measurement, where the dither signal is added in the analog domain, according to some embodiments of the disclosure.
Figure 6:
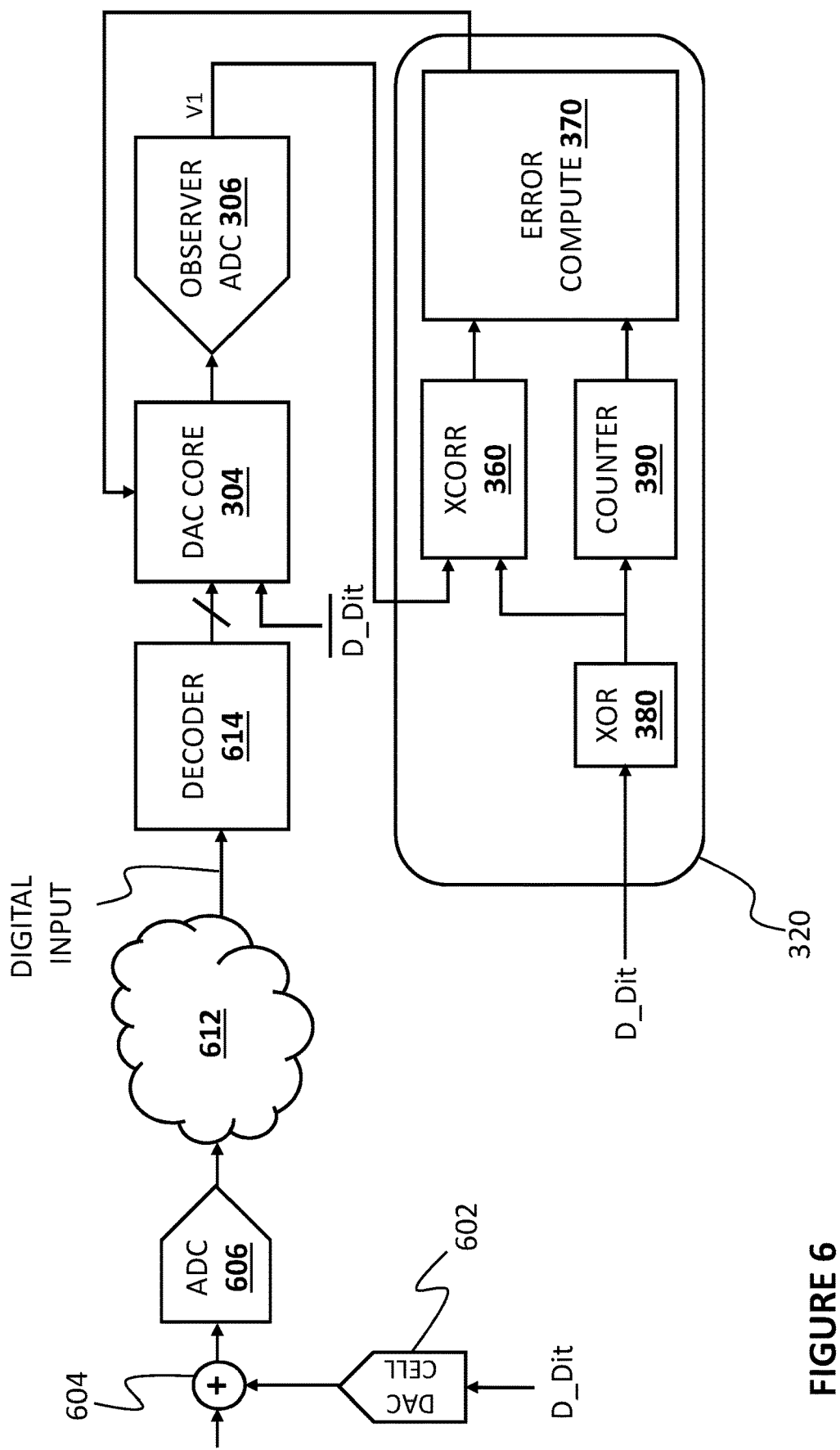
FIG. 6 shows yet another DAC with duty cycle error measurement, where the dither signal is added in the analog domain, according to some embodiments of the disclosure.

For illustration, the decoder 302 in FIG. 3 receives a 4-bit binary digital input having a dither signal D_Dit added thereto, and the binary to thermometer decoder 312 to generates a 15 thermometer coded data bits, shown as B2T[0], B2T[1], ... B2T[13], and B2T[14], from the 4-bit binary digital input. The dither signal D_Dit added to the digital input can affect a data bit, such as B2T[0], and exercise one DAC cell in the DAC core 304. In some embodiments, the dither signal D_Dit is added digitally to the digital input to the binary to thermometer decoder 312. Digital adder 314 of the decoder adds the dither signal D_Dit is added digitally to the digital input. Adding the dither signal to the digital input can be done digitally or in the analog domain, which are illustrated by FIGS. 4-6.

Following the same illustrative example, to convert a 15 thermometer coded data bits to an analog output, the DAC core 304 has 15 DAC cells, each DAC cell driven by a corresponding thermometer coded data bit. An additional DAC cell is added to the DAC core 304 to subtract out the injected dither signal to implement a transparent dithering scheme. Therefore, the DAC core 304 has 16 DAC cells, shown as MSB0, MSB1, ... MSB14, and MSB15. The outputs of the 16 DAC cells are combined/summed to form an analog output of the DAC core 304.

To expose duty cycle error of a DAC cell under calibration, a DAC cell can be selected to receive the dither signal with opposite polarity, $\overline{D\_Dit}$. For instance, the DAC core 304 can include a first DAC cell to receive the dither signal with opposite polarity, $\overline{D\_Dit}$, and a further DAC cells driven by data bits corresponding to the digital input and the dither signal added thereto (e.g., B2T[14-0]). This first DAC cell can thus be the DAC cell under calibration. By controlling the first DAC cell with the dither signal with opposite polarity, $\overline{D}$_Dit, the injected dither signal is cancelled out. To expose duty cycle error of another DAC cell under calibration, a different DAC cell can be selected to receive the dither signal with opposite polarity, $\overline{D}$_Dit, while the rest of the DAC cells are driven by data bits corresponding to the digital input and the dither signal added thereto (e.g., B2T[14-0]).

The decoder 302 can be implemented to allow for different DAC cells to be selected as the DAC cell under calibration, i.e., drive different DAC cells with the dither signal with opposite polarity, $\overline{D}$_Dit. Following the same illustration, the decoder 302 can output 16 bits total, i.e., 15 thermometer coded bits, and one additional bit for the dither signal with opposite polarity, to drive 16 DAC cells respectively. The output bits of the decoder 302 are shown as D[0], D[1], D[2], . . . . D[15] in the FIGURE. The bit for the dither signal with opposite polarity can be barrel shifted among the output bits of the decoder 302, so that the dither signal with opposite polarity, can be applied to each one of the 16 MSB DAC units, one after another. In other words, the decoder 302 can select one of the DAC cells to be the DAC cell under calibration, and another one of the DAC cells to be the DAC cell under calibration after that, and so on. When one DAC cell is selected as the DAC cell under calibration, the DAC cell is driven by the dither signal with opposite polarity, $\overline{D}$_Dit, and the rest of the DAC cells are driven by the thermometer coded data bits, B2T[14-0].

Following the same illustrative example, when measuring the first MSB DAC cell, shown as MSB15, the decoder output D[15] would be the bit for the dither signal with opposite polarity, $\overline{D}$_Dit. Output bits of the decoder 302, D[14] to D[1], would take the value B2T[13-0] from the B2T decoder. Output bit of the decoder 302, D[0], as the extra bit, can take the value of B2T[14], which was replaced by the bit for the dither signal with opposite polarity, $\overline{D}$_Dit, driving MSB15.

When measuring the second MSB DAC cell, shown as MSB14, the decoder output D[14] would be the bit for the dither signal with opposite polarity, $\overline{D}$_Dit. Output bits of the decoder 302, D[15] and D[13-1], can take the value B2T[14] and B2T[12-0] from the B2T decoder. Output bit of the decoder 302, D[0], as the extra bit, can take the value of B2T[13], which was replaced by the bit for the dither signal with opposite polarity, $\overline{D}$_Dit, driving MSB14.

When measuring the third MSB DAC cell, shown as MSB13, the decoder output D[13] would be the bit for the dither signal with opposite polarity, $\overline{D}$_Dit. Output bits of the decoder 302, D[15], D[14], and D[12-1], can take the value B2T[14], B2T[13], and B2T[11-0] from the B2T decoder. Output bit of the decoder 302, D[0], as the extra bit, can take the value of B2T[12], which was replaced by the bit for the dither signal with opposite polarity, $\overline{D}$_Dit, driving MSB13.

This barrel shifting can be continue onwards to select other MSB DAC cells to be the DAC cell under calibration.

When measuring the last MSB DAC cell, shown as MSB0, the decoder output D[0] would be the bit for the dither signal with opposite polarity, $\overline{D}$_Dit. Output bits of the decoder 302, D[15-1], can take the value B2T[14-0] from the B2T decoder.

As shown in FIG. 3, the barrel shifting can be implemented using multiplexers, shown as multiplexers $316_{15}$, $316_{15}$, . . . $316_1$, and $316_0$, to select and output the appropriate bits for the output bits of the decoder 302. For example, the decoder 302 can include a first multiplexer $316_{15}$ to output one of: a first bit of the data bits (e.g., B2T[14]), and the dither signal with opposite polarity, $\overline{D}$_Dit. The decoder 302 can include a second multiplexer $316_{14}$ to output one of: a second bit of the data bits (e.g., B2T[13]), and the dither signal with opposite polarity, $\overline{D}$_Dit. The decoder 302 can include a third multiplexer $316_O$ to output one of: the data bits (e.g., B2T[14-0]), and the dither signal with opposite polarity $\overline{D}$_Dit.

While the illustrative example describes barrel shifting where the DAC cells are selected sequentially one after another, e.g., from MSB15 to MSB0, the order in which the DAC cells are selected as the DAC cell under calibration does not affect the background measurement technique, and any sequence of selection of DAC cells as the DAC cell under calibration can be employed.

Other suitable switching logic can be implemented in decoder 302 to select one DAC cell to be driven by the bit for the dither signal with opposite polarity, $\overline{D}$_Dit, and provide the data bits corresponding to the digital input and the dither signal added thereto (e.g., B2T[14-0]). For instance, the arrangement the data bits corresponding to the digital input and the dither signal added thereto (e.g., B2T[14-0]) being provided as the output bits of the decoder 302 may be scrambled in some way (as the data bits would be for a dynamic element matching scheme).

Note that the first DAC cell (e.g., DAC cell under calibration) can have the same weight as the dither signal. However, in some cases, the first DAC cell can have a different weight as the dither signal.

A VCO ADC as the Observer ADC

Referring back to FIG. 3, the observer ADC 308 quantizes the output of the DAC core 304, which is observable at the output of amplifier 306 (i.e., an analog output of the DAC cells). The output of the DAC core 304 being observed is generated as a result of the transparent dither being injected into the system, e.g., generated as a result from a digital input having a dither signal added thereto driving decoder 302, and the dither signal with opposite polarity, $\overline{D}$_Dit, driving the first DAC cell and cancelling the added dither signal. The error charges caused by the duty cycle error would be observable and extractable from the output of the DAC core 304. The observer ADC 308 generates a digital output, shown as V1. The digital output can be used to extract the duty cycle error of the DAC cell under calibration.

The observer ADC 308 can be a VCO ADC. A VCO ADC is a first-order delta sigma ADC with the VCO acts as a continuous-time integrator with infinite DC gain, i.e., infinite gain at DC, or zero frequency. An integrator can be particularly effective and efficient at integrating error charge el as seen in FIG. 2. Other non-integrating ADCs can also extract the error charge el, but may have to run at a much higher speed than the VCO ADC or an integrating ADC. In addition, because a VCO ADC is mostly digital, VCO ADC has very small footprint in 28 nm process and can continue scale with process. One VCO ADC can be as large as 0.1 mm² and consumes 25 mW. The VCO ADC acting as the observer ADC 308 can digitize the output of the DAC core 304 through the amplifier 306 (e.g., a transimpedance amplifier). The extra load from the VCO ADC acting as the observer ADC 308 to the amplifier output is relatively small and would not impact the performance of the normal path through the mixer 310.

Digital Processing Circuitry to Extract the Duty Cycle Error

The DAC 300 further includes digital processing circuitry 320 to cross-correlate the digital output V1 and a switching bit stream of the dither signal D_Dit, and to extract a duty cycle error of the first DAC cell based on the cross-correlation of the digital output V1 and the switching bit stream of the dither signal D_Dit.

The digital processing circuitry 320 includes a switching bit stream generator 380 to generate a switching bit stream from the dither signal D_Dit. The switching bit stream represents switching instances in the dither signal. For instance, the switching bit stream has a value of one to represent the dither signal D_Dit transitioning states, and the switching bit stream has a value of zero to represent the dither signal D_Dit having a same state. In some embodiments, the switching bit stream generator 380 has an exclusive-or operator that takes a current value of the dither signal D_Dit and a previous value of the dither signal D_Dit as inputs and outputs a value of the switching bit stream. Accordingly, a value of the switching bit stream is "0" when a current value and a previous value dither signal D_Dit is the same, and a value of the switching bit stream is "1" when a current value and a previous value dither signal D_Dit are different (i.e., the dither signal D_Dit transitioned states). The exclusive-or operator repeats the operation for other values of the dither signal D_Dit to generate other values of the switching bit stream.

The digital processing circuitry 320 can include a counter 390 to count switching instances in the dither signal D_Dit. In some embodiments, the counter 390 determines a switching count by accumulating values of the switching bit stream (e.g., accumulating the number of 1's in the switching bit stream). In some embodiments, the counter 390 determines a switching count by counting state transitions in the dither signal D_Dit.

The digital processing circuitry 320 can include cross-correlation circuitry 360 to perform cross-correlation of data points of digital output V1 and the switching bit stream of the dither signal D_Dit. The cross-correlation circuitry 360 is explained in greater detail in the passages describing the exemplary cross-correlation results shown in FIGS. 8-13.

The digital processing circuitry 320 further includes error computation circuitry 370 to compute the duty cycle error from the cross-correlation result from cross-correlation circuitry 360. For instance, the error computation circuitry 370 can extract the duty cycle error of the DAC cell under calibration based on (1) a zeroth tap of the cross-correlation of the switching bit stream and the digital output, and (2) the switching count.

Adding the Dither Signal

As discussed previously, depending on the implementation, the dither signal D_Dit can be added in different ways.

FIG. 4 shows a DAC with duty cycle error measurement, where the dither signal D_Dit is added digitally, according to some embodiments of the disclosure. To add the dither signal digitally, a digital adder 314 is included in the decoder 302 to add the dither signal D_Dit to the digital input of the decoder 302.

FIG. 5 shows a DAC with duty cycle error measurement, where the dither signal D_Dit is added in the analog domain, according to some embodiments of the disclosure. A decoder 502 is implemented as discussed herein to supply data bits and a bit of the dither signal with opposite polarity to the DAC cells. However, decoder 502 lacks a digital adder for adding the dither signal digitally. The dither signal D_Dit is added in the analog domain. The dither signal D_Dit in the DAC core 504, which includes a dither DAC cell 506, e.g., MSB16, that is driven by the dither signal D_Dit. In this illustrative example, the dither DAC cell 506 receives the dither signal D_Dit. Another DAC cell in the DAC core 504, driven by the dither signal with opposite polarity, $\overline{D}$_Dit, cancels out the dither added to implement the transparent dithering scheme. The DAC core 504 thus has 17 DAC cells (i.e., two additional DAC cells). The dither DAC cell 506 can be seen as a reference DAC cell against which other DAC cells are measured. The barrel shifting implemented by decoder 502 (as described in relation to FIG. 3) can enable measurement the duty cycle error of other DAC cells in DAC core 504, one DAC cell at a time. The dither DAC cell 506 can have the same weight as the DAC cell under calibration, or the dither DAC cell 506 can have a different weight as the DAC cell under calibration.

FIG. 6 shows a DAC with duty cycle error measurement, where the dither signal D_Dit is added in the analog domain, according to some embodiments of the disclosure. The signal chain seen in FIG. 6 can be found in a transceiver. A decoder 614 is implemented as discussed herein to supply data bits and a bit of the dither signal with opposite polarity to the DAC cells. However, decoder 614 lacks a digital adder for adding the dither signal digitally. ADC 606 is upstream of the DAC, and may generate the digital input to decoder 614. The dither signal D_Dit is added to the analog input of the ADC 606 in the analog domain. In this illustrative example, a dither DAC cell 602 is included, and the dither DAC cell 602 receives the dither signal D_Dit. A summation node 604 adds an analog equivalent of the dither signal D_Dit (generated by the dither DAC cell 602) to an analog input of ADC 606. The ADC 606 generates a digital output signal having the dither signal added thereto. The digital output signal can be processed by digital processing circuitry 612. The digital processing circuitry 612 can generate the digital input having the dither signal added thereto. The digital input having the dither signal added thereto is then processed by decoder 614. The dither DAC cell 602 can have the same weight as the first DAC cell (e.g., a DAC cell under calibration), or the dither DAC cell 602 can have a different weight as the first DAC cell.

The signal path between the point where the dither signal is injected and the point the dither signal is cancelled in FIG. 6 is less controlled than the signal path between the point where the dither signal is injected and the point the dither signal is cancelled in FIG. 5. Accordingly, the implementation in FIG. 6 is less preferred since the measurement scheme may be polluted by other errors in the signal path.

Additionally, injecting the dither signal in the analog domain (e.g., FIGS. 5-6) is less preferred than dither injection in the digital domain (e.g., FIGS. 3-4) because the dither DAC cell itself can introduce an error to the measurement scheme.

Deriving the Duty Cycle Error Based on Cross-Correlation and Exemplary Cross-Correlation Results A duty cycle error of the DAC cell under calibration is extractable from the digital output generated by the observer ADC, the switching bit stream of the dither signal, and the switching count of the switching bit stream. Specifically, digital processing circuitry can cross-correlate the digital output and the switching bit stream of the dither signal and extract the duty cycle error of the DAC cell under calibration based on the cross-correlation of the digital output and the switching bit stream of the dither signal. Since the amount of error charge introduced by duty cycle error is dependent on a switching count, the switching count of the dither signal is also taken into account when extracting the duty cycle error of DAC cell under calibration.

Figure 7:
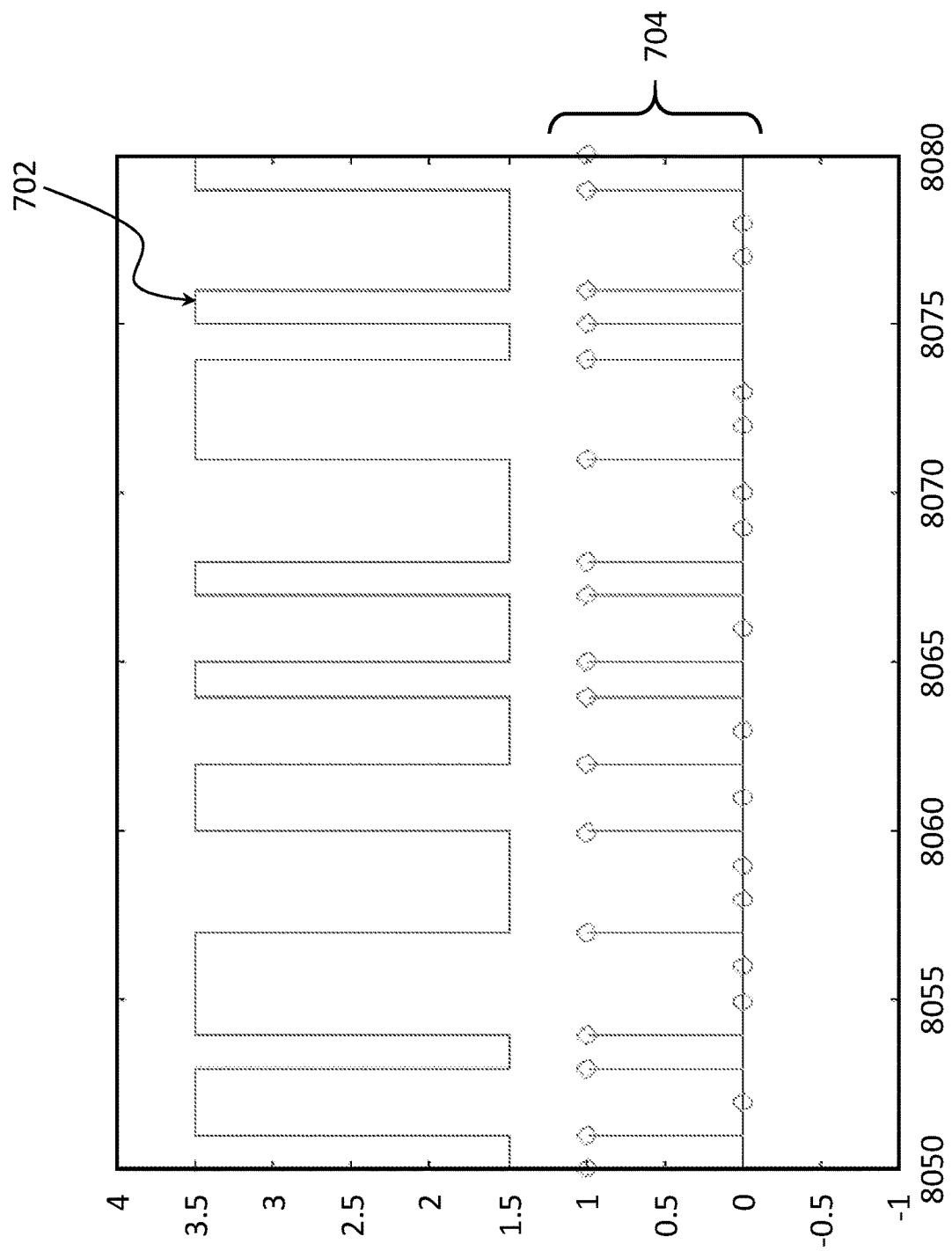
FIG. 7 shows a data stream of a dither signal and a switching bit stream of the dither signal, according to some embodiments of the disclosure.
Figure 8:
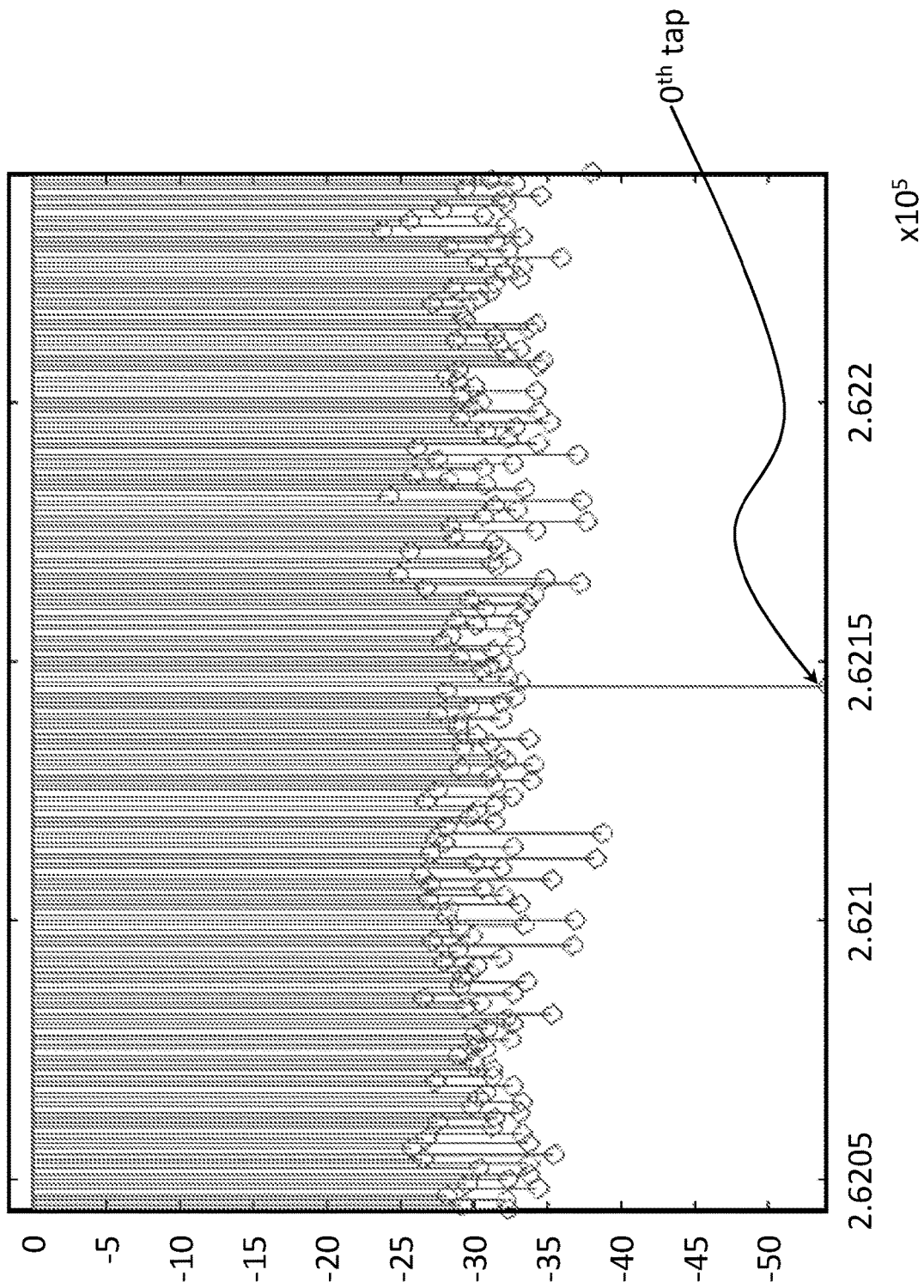
FIG. 8-13 show respective cross-correlation results for six DAC cells, according to some embodiments of the disclosure.
Figure 9:
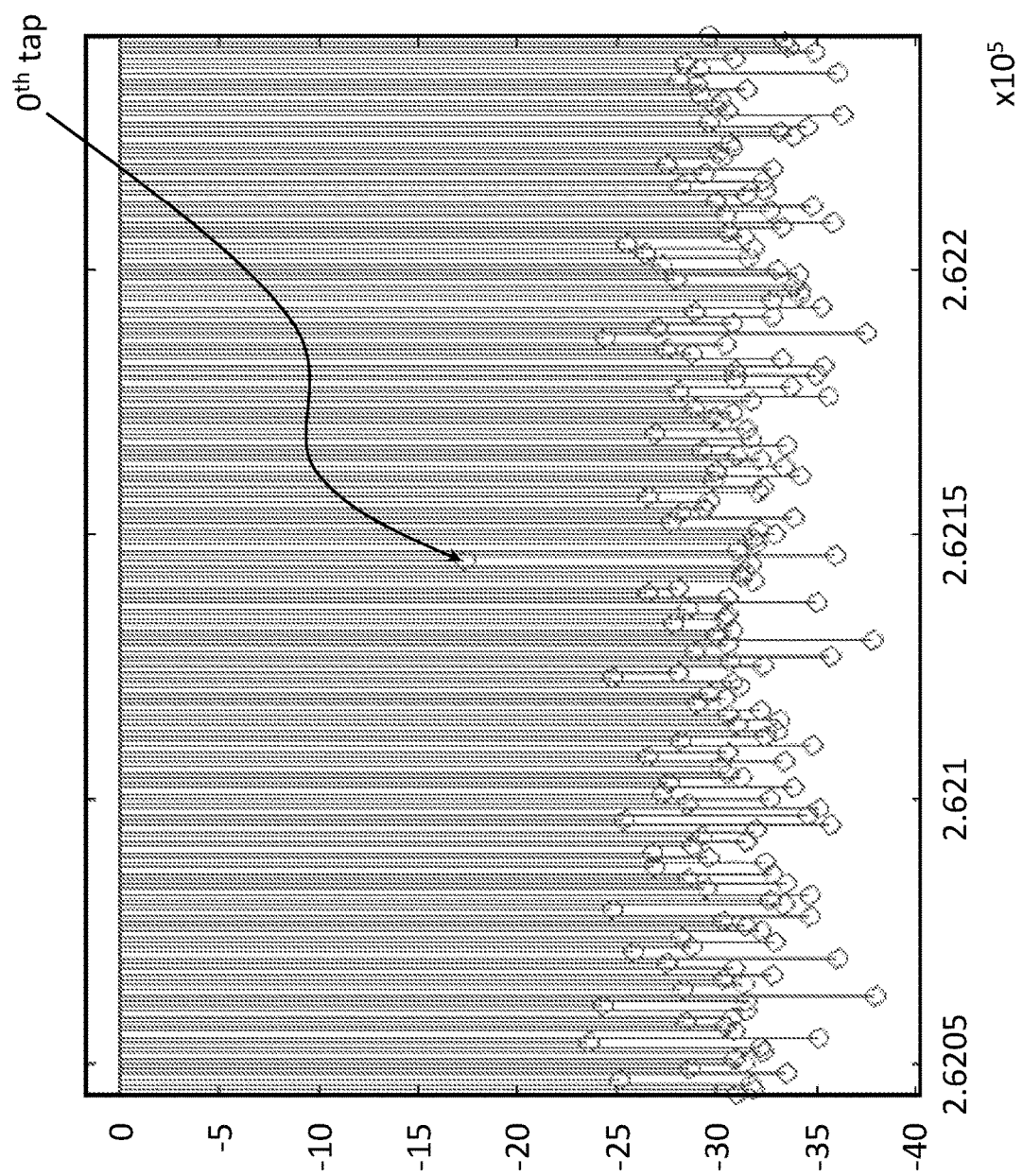
Figure 10:
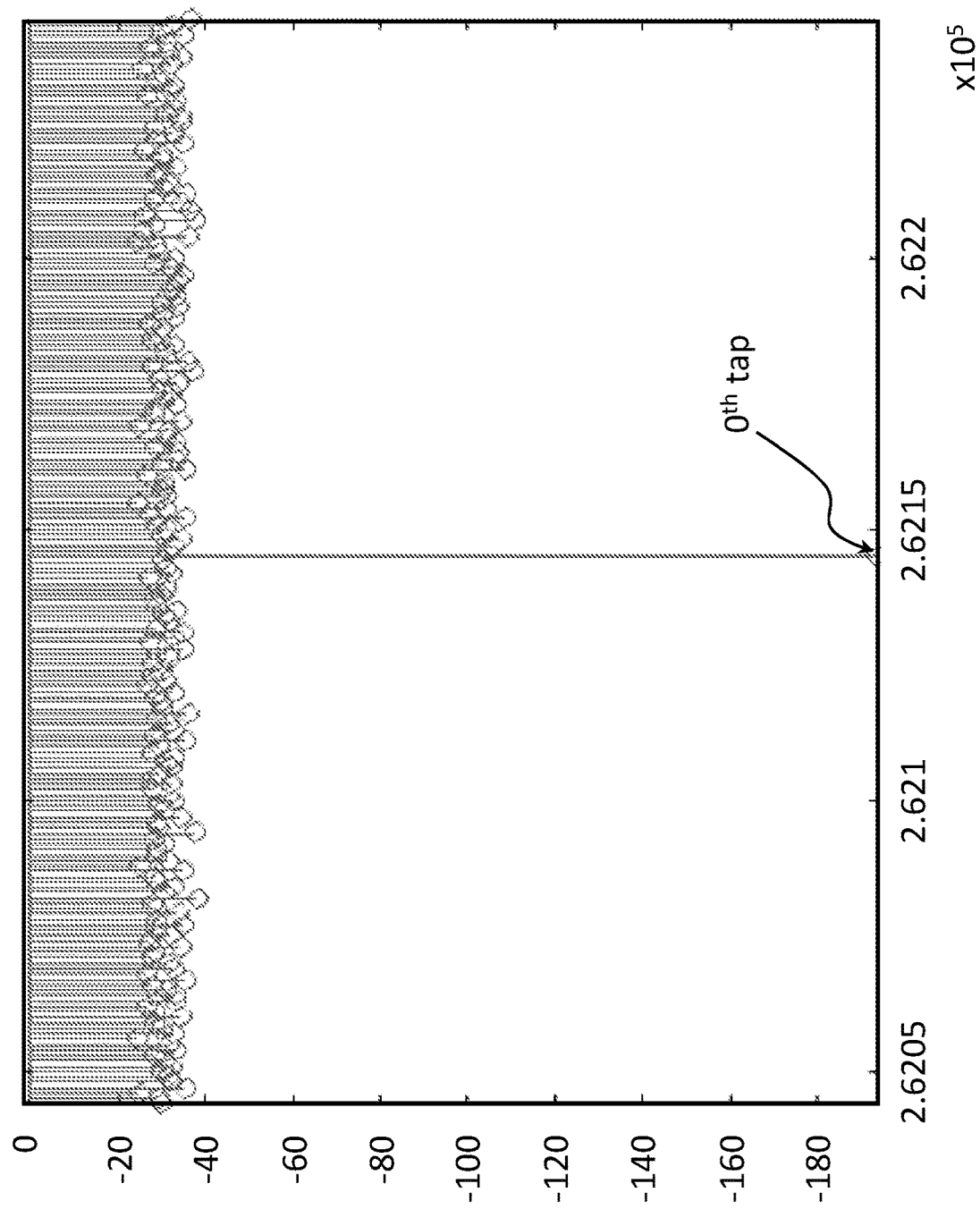
Figure 11:
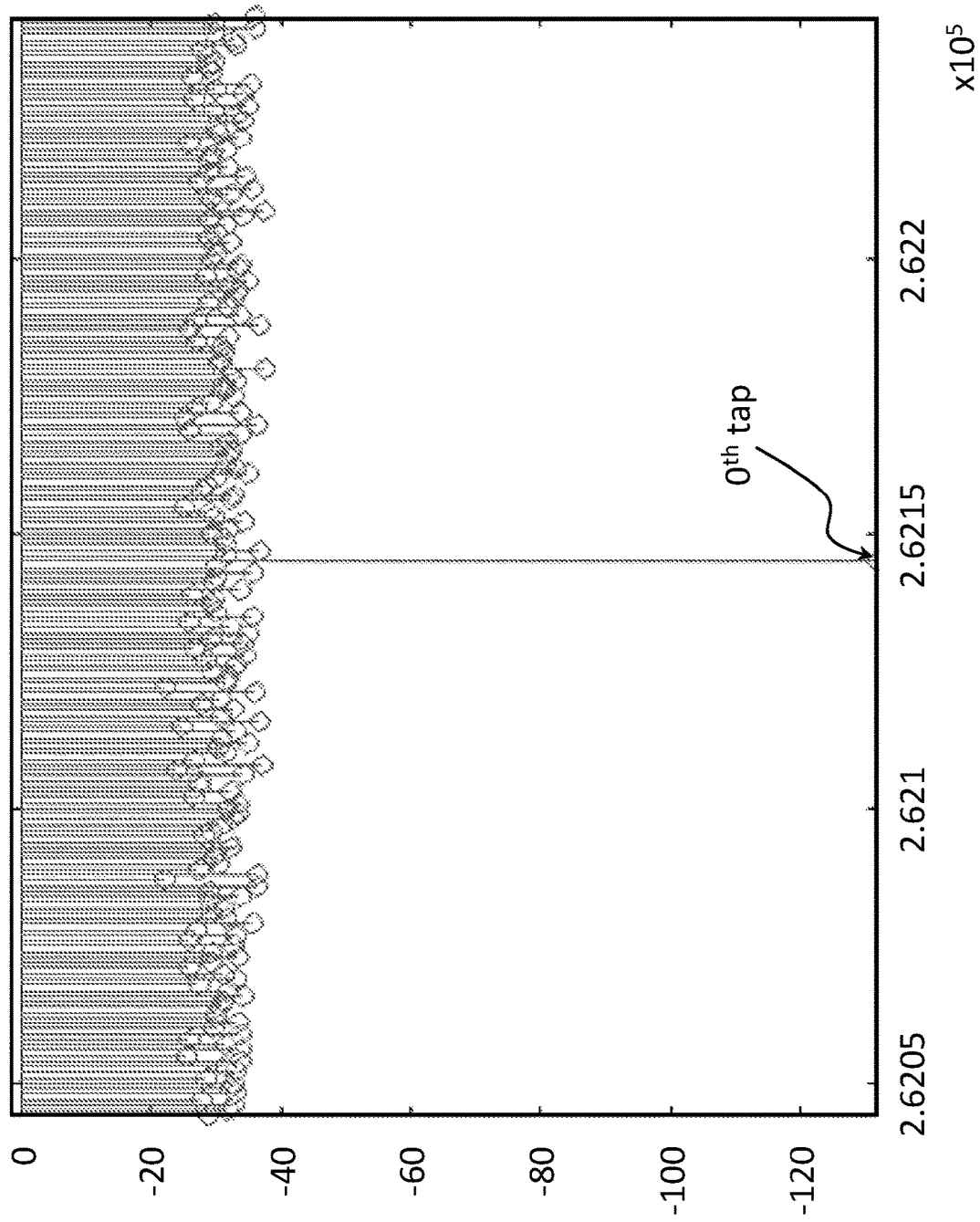
Figure 12:
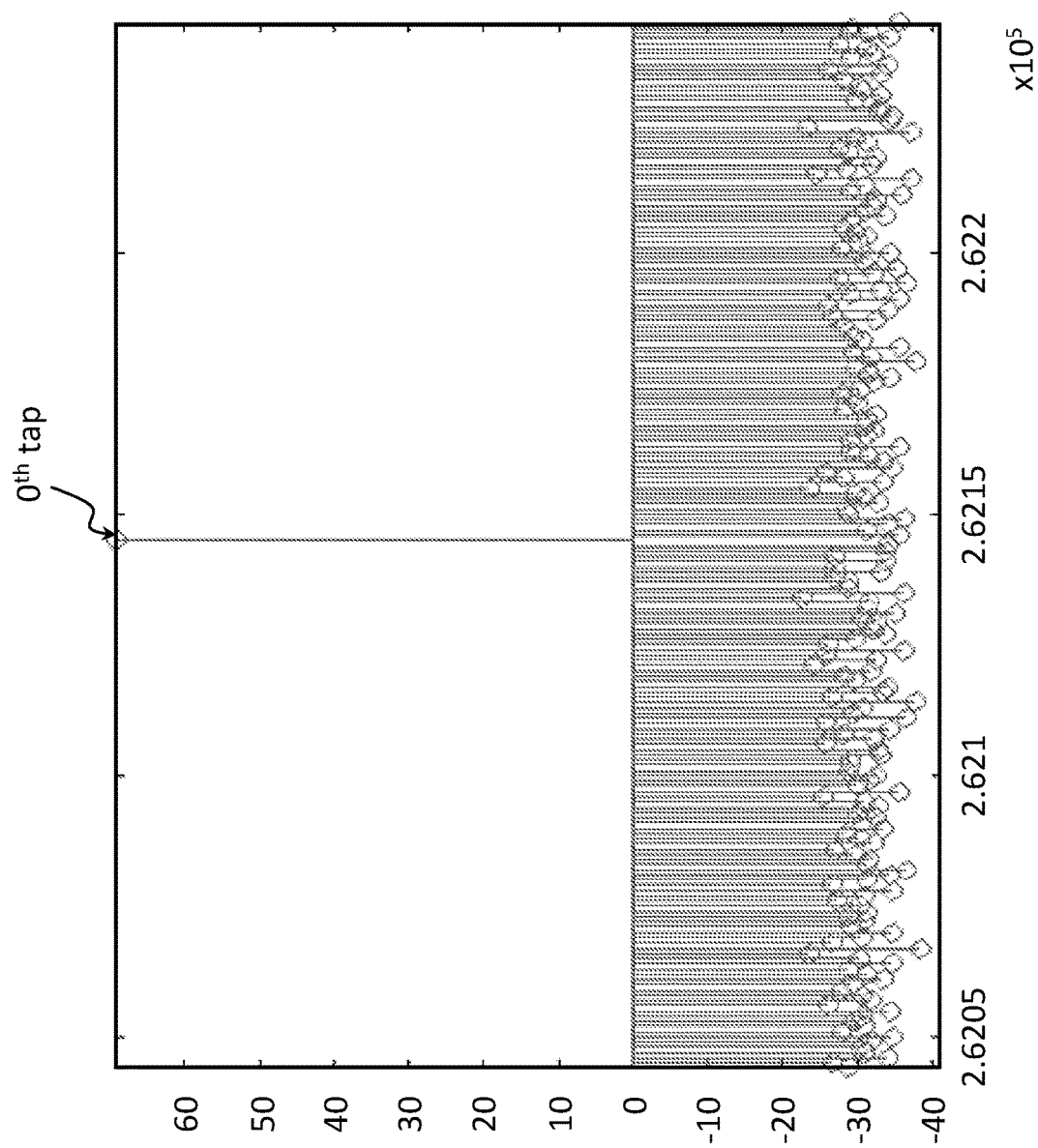
Figure 13:
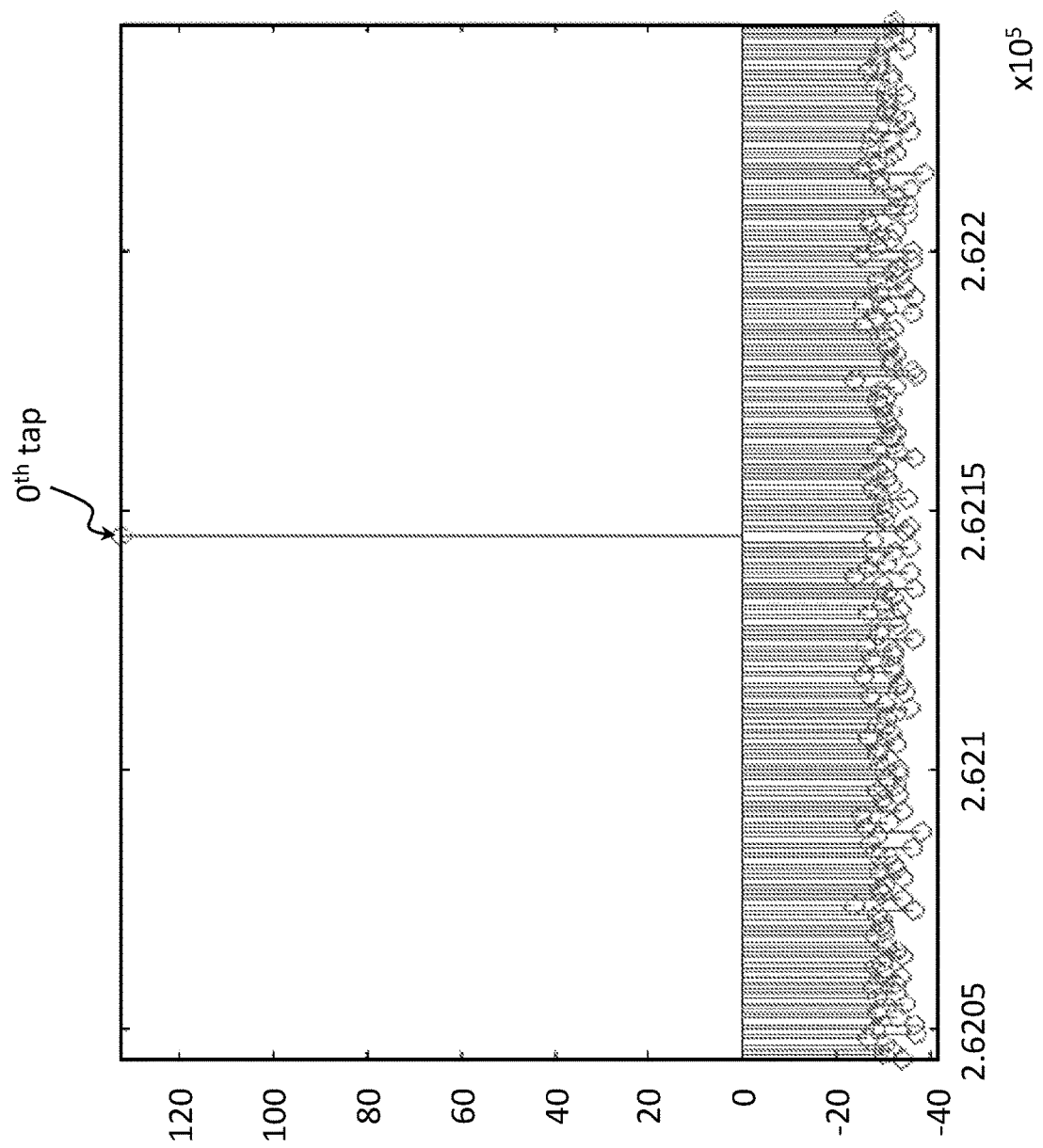

FIG. 7 shows a data stream 702 of a dither signal and a switching bit stream 704 of the dither signal, according to some embodiments of the disclosure. The data stream 702 of a dither signal can alternate between different states or maintain state in a random fashion. When the value of the dither signal changes, or the dither signal transitions states, the switching bit stream 704 has a value of 1. When the value of the dither signal remains the same, or the dither signal has the same state, the switching bit stream 704 has a value of 0.

Referring back to FIG. 2, the top waveform labeled $i_0$ can correspond to a dither signal added (digitally or in the analog domain), and can be treated as the ideal waveform. The middle waveform labeled $i_1$ can correspond to the first DAC cell, e.g., a DAC cell under calibration, driven by the dither signal with opposite polarity. The middle waveform shows the non-ideality introduced by duty cycle error in the DAC path. Accordingly, the middle waveform as a different duty cycle from the top waveform, representing a duty cycle error. The transparent dither scheme means that the DAC output would yield a sum of the top and middle waveforms, i.e., the bottom waveform labeled $i_0+i_1$. The bottom waveform can represent the difference of the DAC cell exercised by the injected dither signal, and the DAC cell under calibration. Accordingly, the DAC output having a transparent dither having the sum of the top and middle waveforms has and exposes error charge coming from duty cycle error. Error charges labeled el represents error coming from duty cycle error (where an error charge with label el is present at each switching instance/occurrence). The observer ADC, e.g., a VCO ADC, can act as an integrator and digitize the DAC output having the transparent dither, to capture the error charges with label el, introduced at each switching instance/occurrence. Accordingly, the duty cycle error, as represented by el can be obtained directly from the value of the $0^{th}$ tap of the cross-correlation result and the switching count.

Note that the duty cycle errors extracted for the plurality of DAC cells in the manner described are absolute errors representing the duty cycle errors of the DAC cells. Appropriate correction can be implemented to adjust or tune a given DAC cell to reduce the absolute duty cycle error, and/or drive the absolute duty cycle error to zero.

The cross-correlation can be performed, e.g., by cross-correlation circuitry 360 of FIGS. 3-6. The $0^{th}$ tap of the cross-correlation result include information of duty cycle error, and can be used, e.g., by error computation circuitry 370 of FIGS. 3-6, along with a switching count of the measurement, to extract/estimate duty cycle error of the DAC cell under calibration from the cross-correlation.

FIG. 8-13 show respective cross-correlation results for six DAC cells, according to some embodiments of the disclosure. Strong correlations are observed in the cross-correlation results. The $0^{th}$ tap of the various cross-correlation results are labeled in each FIGURE.

Performing cross-correlation can be computationally expensive, and thus, the background measurement scheme may run only from time to time (i.e., not all the time).

Methods for Extracting Duty Cycle Errors

Figure 14:
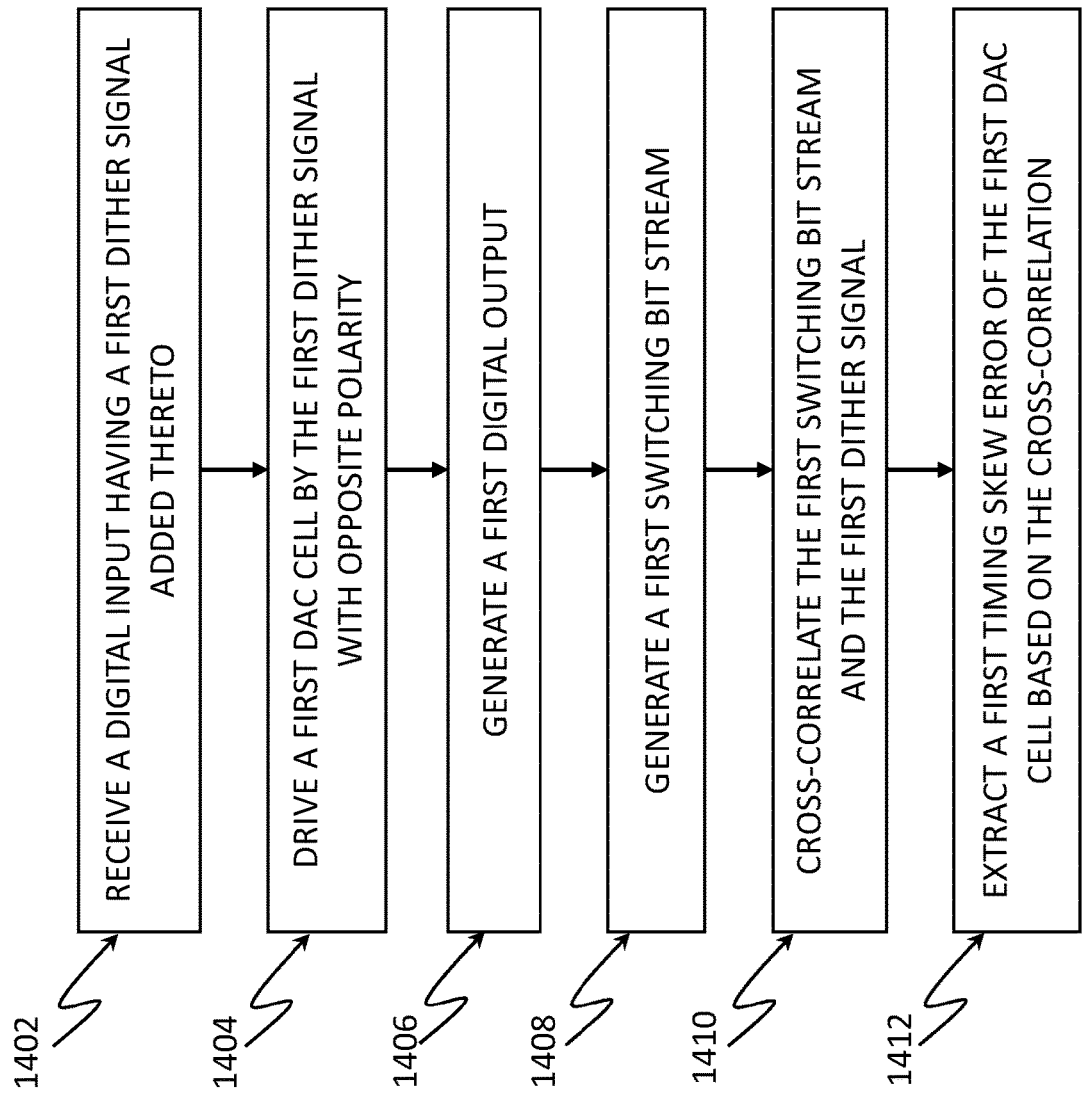
FIG. 14 is a flow diagram illustrating a method for extracting duty cycle errors of a DAC, according to some embodiments of the disclosure.

FIG. 14 is a flow diagram illustrating a method for extracting duty cycle errors of a DAC, according to some embodiments of the disclosure. The DAC can include a decoder (e.g., decoder 302 of FIGS. 3 and 4, decoder 502 of FIG. 5, and decoder 614 of FIG. 6) and DAC cells driven by outputs of the decoder (e.g., D[15]-D[0] of FIG. 3).

In 1402, the decoder can receive a digital input having a first dither signal added thereto. An example of the first dither signal is the dither signal D_Dit as seen in FIGS. 3-6.

In 1404, a first DAC cell (e.g., a DAC cell under calibration as described in relation to FIG. 3) can be driven by the first dither signal with opposite polarity. As previously illustrated by FIG. 3, DAC cell labeled MSB15, if selected as the DAC cell under calibration, can be driven by a bit of the dither signal with opposite polarity, $\overline{D}\_Dit$. The decoder can implement switching circuitry to output a bit of the dither signal with opposite polarity, $\overline{D}\_Dit$, as the bit D[15] that drives the DAC cell labeled MSB15. The first DAC driven by the first dither signal with opposite polarity cancels out the dither signal, D_Dit, added to the digital input, effectively implementing a transparent dithering scheme.

In 1406, an observer ADC (e.g., observer ADC 308 of FIGS. 3-6) can generate a first digital output (e.g., V1 of FIGS. 3-6) by digitizing a first analog output of the DAC resulting from the first dither signal with opposite polarity driving the first DAC cell (i.e., resulting from the transparent dither being applied).

In 1408, digital processing circuitry (e.g., digital processing circuitry 320 of FIGS. 3-6, specifically, switching bit stream generator 380) can generate a first switching bit stream based on the first dither signal. In some embodiments, the first switching bit stream has a value of one to represent the first dither signal transitioning states, and the first switching bit stream has a value of zero to represent the first dither signal having a same state. In some embodiments, generating the first switching bit stream comprises applying an exclusive-or operation on a value of the first switching bit stream and a previous value of the first switching bit stream.

In 1410, digital processing circuitry (e.g., digital processing circuitry 320 of FIGS. 3-6, specifically, cross-correlation circuitry 360) can cross-correlate the first switching bit stream and the first digital output. Examples of cross-correlation results are shown in FIGS. 8-13.

In 1412, digital processing circuitry (e.g., digital processing circuitry 320 of FIGS. 3-6, specifically, error computation circuitry 370) can extract a first duty cycle error of the first DAC cell based on the cross-correlation of the first switching bit stream and the first digital output. Examples of cross-correlation results and how the cross-correlation exposes duty cycle error of the DAC cell under calibration are explained in passages associated with FIGS. 2, and 7-13.

In some embodiments, the decoder or other suitable circuitry in the digital domain adds the first dither signal to the digital input digitally. Adding the first dither signal digitally is illustrated by FIGS. 3-4. In some embodiments, the first dither signal is added to an analog input signal of an ADC, thus, in an analog domain. The ADC generates the digital input having the first dither signal added thereto. Various embodiments that adds the first dither signal in an analog domain is illustrated by FIGS. 5-6.

In some embodiments, the digital processing circuitry can further determine a first switching count from the first switching bit stream. Extracting the first duty cycle error of the first DAC cell can further include normalizing the first duty cycle error based on the first switching count. In some embodiments, determining the first switching count from the first switching bit stream comprises accumulating values of the first switching bit stream in a counter.

As discussed previously, the $0^{th}$/center tap of the cross-correlation result yields the duty cycle error. Extracting the first duty cycle error can include deriving the first duty cycle error based on a value of a zeroth tap of the cross-correlation of the first switching bit stream and the first digital output.

In some embodiments, there may be a constant offset in the duty cycle error measurements, which is caused by a DC offset in the measurement path. To extract and/or remove the constant offset in the measurements, the duty cycle error can be measured twice for a DAC cell under calibration, with different switching counts. For instance, the decoder can receive a second digital input having a second dither signal added thereto. The first DAC cell can be driven by the second dither signal with opposite polarity. The observer ADC can generate a second digital output by digitizing a second analog output of the DAC resulting from the second dither signal with opposite polarity driving the first DAC cell. The digital processing circuitry can generate a second switching bit stream based on the second dither signal, wherein the second switching bit stream has a second switching count that is different from a first switching count of the first switching bit stream. The digital processing circuitry can cross-correlate the second switching bit stream and the second digital output. The digital processing circuitry can extract the first duty cycle error of the first DAC cell based on a first value of a zeroth tap of the cross-correlation of the first switching bit stream and the first digital output, and a second value of a zeroth tap of the cross-correlation of the second switching bit stream and the second digital output. The first switching count and the second switching count are used in extracting the first duty cycle error of the first DAC cell, as well. The two measurements sets up two equations with two unknowns (e.g., equations 1 and 2), which can allow for the constant offset caused by the DC offset in the measurement path and the duty cycle error to be determined.

To measure the duty cycle error of another DAC cell under calibration, 1402-1412 can be repeated for the second DAC cell. For instance, the method can further include receiving, by the decoder, the digital input having a third dither signal added thereto, driving a second DAC cell by the third dither signal with opposite polarity, generating a third digital output by digitizing a third analog output of the DAC resulting from the third dither signal with opposite polarity driving the second DAC cell, generate a third switching bit stream based on the third dither signal, cross-correlating the third switching bit stream and the third digital output; and extracting a second duty cycle error of the second DAC cell based on the cross-correlation of the third switching bit stream and the third digital output. Various switching schemes, such as the ones illustrated in FIG. 3, can be used to select the second DAC cell or any other DAC cells to be the next DAC cell under calibration.

Figure 15:
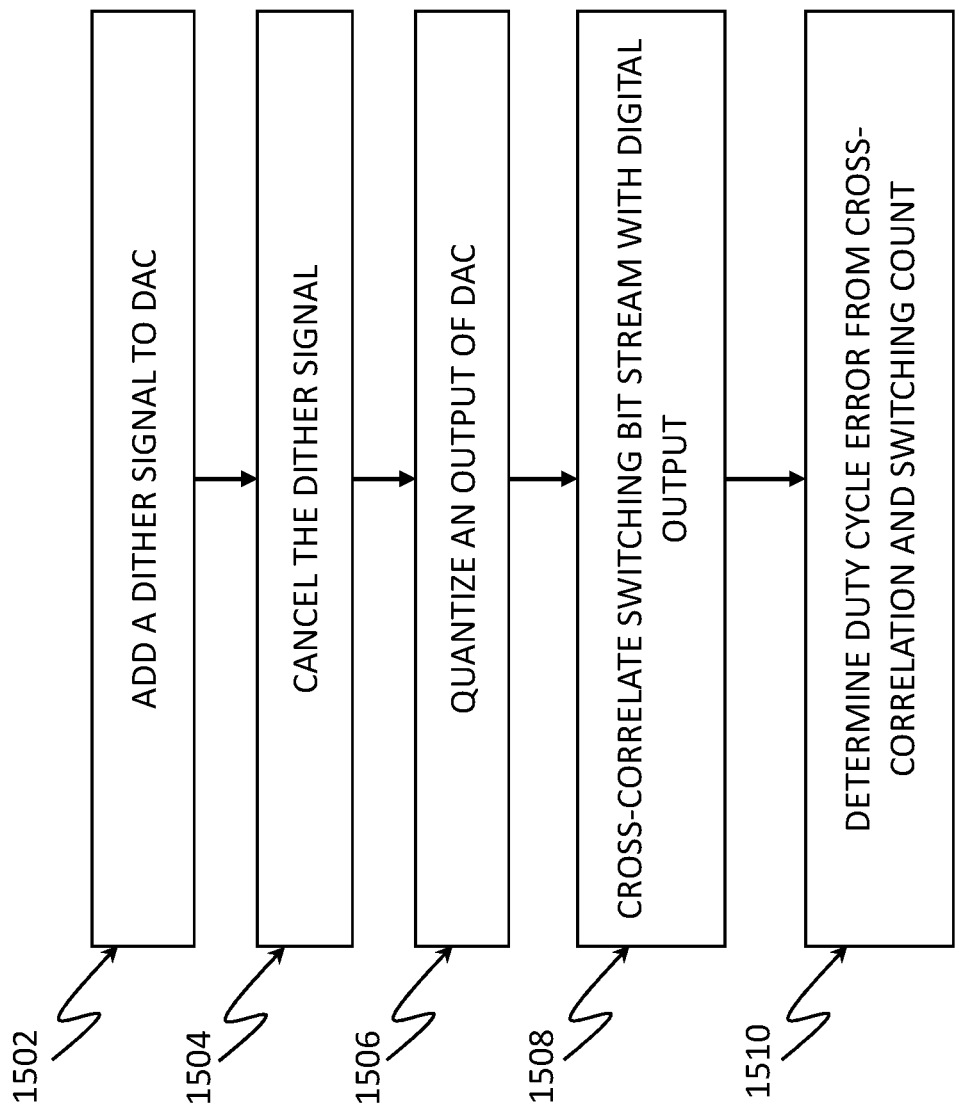
FIG. 15 is a flow diagram illustrating another method for extracting duty cycle errors of a DAC, according to some embodiments of the disclosure.

FIG. 15 is a flow diagram illustrating another method for extracting duty cycle errors of a DAC, according to some embodiments of the disclosure. In 1502, a dither signal is added to the DAC. Various schemes for adding the dither signal to the DAC are illustrated in FIGS. 3-6. In 1504, a DAC cell in the DAC cancels the dither signal injected to the DAC. For instance, the DAC cell can be driven by the dither signal with opposite polarity to cancel the added dither signal. As a result of 1502 and 1504, a transparent dither is injected (as illustrated by the examples described in relation to FIGS. 3-6). In 1506, an observer ADC (e.g., observer ADC 308 of FIGS. 3-6) quantizes the output of the DAC and generates a digital output. The digital processing circuitry (e.g., digital processing circuitry 320 of FIGS. 3-6) extracts a duty cycle error of the DAC cell, from the digital output. For example, in 1508, the digital processing circuitry cross-correlates a switching bit stream of the dither signal with the digital output. An example of the dither signal and the switching bit stream of the dither signal is shown in FIG. 7. In 1510, the digital processing circuitry obtains the duty cycle error of the DAC cell based on (1) a value of a zeroth tap of the cross-correlation of the switching bit stream and the digital output, and (2) a switching count of the switching bit stream.

The cross-correlation results yield the duty cycle error of the DAC cell under calibration. As discussed previously, the duty cycle error can be obtained from the value of the zeroth tap of the cross-correlation result. Examples of cross-correlation results and how the cross-correlation exposes the duty cycle error of the DAC cell under calibration are explained in passages associated with FIGS. 2, and 7-13.

To remove the constant offset caused by a DC offset in the measurement path, the method can further include: adding a further dither signal to the DAC, cancelling, by the DAC cell in the DAC, the further dither signal injected to the input of the DAC, quantizing the output of the DAC and generating a further digital output; cross-correlating a further switching bit stream of the further dither signal with the further digital output; and determining the duty cycle error of the DAC cell further based on (3) a value of a zeroth tap of the cross-correlation of further switching bit stream of the further dither signal with the further digital output, and (4) a further switching count of the further switching bit stream, wherein the further switching count is different from the switching count.

Adding the dither signal to the DAC can include adding the dither signal to the input of the DAC digitally. Such a scheme is illustrated by FIGS. 3-4. Adding the dither signal to the DAC can include adding the dither signal to a dither DAC cell in the DAC core. Such a scheme is illustrated by FIG. 5. In some cases, adding the dither signal to the DAC includes adding the dither signal to an analog input signal of an ADC, and generating, by the ADC, the input of the DAC having the dither signal added thereto. Such a scheme is illustrated by FIG. 6.

To measure duty cycle error of another DAC cell under calibration, 1502-1510 can be repeated for another DAC cell. The DC offset can be removed similarly for another DAC cell. Various switching schemes, such as the ones illustrated in FIG. 3, can be used to select the other DAC cell or any other DAC cells to be the next DAC cell under calibration.

EXAMPLES

Example 1 is a method for extracting errors of a digital to analog converter (DAC) having a decoder and a plurality of DAC cells driven by outputs of the decoder, the method comprising: receiving, by the decoder, a digital input having a first dither signal added thereto; driving a first DAC cell by the first dither signal with opposite polarity; generating a first digital output by digitizing a first analog output of the DAC resulting from the first dither signal with opposite polarity driving the first DAC cell; generate a first switching bit stream based on the first dither signal; cross-correlating the first switching bit stream and the first digital output; and extracting a first duty cycle error of the first DAC cell based on the cross-correlation of the first switching bit stream and the first digital output.

In Example 2, the method of Example 1 can optionally include the first switching bit stream having a value of one to represent the first dither signal transitioning states; and the first switching bit stream having a value of zero to represent the first dither signal having a same state.

In Example 3, the method of Example 1 or 2 can optionally include generating the first switching bit stream comprising: applying an exclusive-or operation on a value of the first switching bit stream and a previous value of the first switching bit stream.

In Example 4, the method of any one of Examples 1-3 can optionally include determining a first switching count from the first switching bit stream; wherein extracting the first duty cycle error of the first DAC cell comprises normalizing the first duty cycle error based on the first switching count.

In Example 5, the method of Example 4 can optionally include determining the first switching count from the first switching bit stream comprising: accumulating values of the first switching bit stream in a counter.

In Example 6, the method of any one of Examples 1-5 can optionally include extracting the first duty cycle error comprising: deriving the first duty cycle error based on a value of a zeroth tap of the cross-correlation of the first switching bit stream and the first digital output.

In Example 7, the method of any one of Examples 1-6 can optionally include: receiving, by the decoder, a second digital input having a second dither signal added thereto; driving the first DAC cell by the second dither signal with opposite polarity; generating a second digital output by digitizing a second analog output of the DAC resulting from the second dither signal with opposite polarity driving the first DAC cell; generating a second switching bit stream based on the second dither signal, wherein the second switching bit stream has a second switching count that is different from a first switching count of the first switching bit stream; and cross-correlating the second switching bit stream and the second digital output.

In Example 8, the method of Example 7 can optionally include extracting the first duty cycle error comprising: extracting the first duty cycle error of the first DAC cell based on a first value of a zeroth tap of the cross-correlation of the first switching bit stream and the first digital output, and a second value of a zeroth tap of the cross-correlation of the second switching bit stream and the second digital output.

In Example 9, the method of any one of Examples 1-8 can optionally include receiving, by the decoder, the digital input having a third dither signal added thereto; driving a second DAC cell by the third dither signal with opposite polarity; generating a third digital output by digitizing a third analog output of the DAC resulting from the third dither signal with opposite polarity driving the second DAC cell; generate a third switching bit stream based on the third dither signal; cross-correlating the third switching bit stream and the third digital output; and extracting a second duty cycle error of the second DAC cell based on the cross-correlation of the third switching bit stream and the third digital output.

In Example 10, the method of any one of Examples 1-9 can optionally include: adding, by the decoder, the first dither signal to the digital input digitally.

In Example 11, the method of any one of Examples 1-9 can optionally include: adding the first dither signal to an analog input signal of an analog to digital converter; and generating, by the analog to digital converter, the digital input having the first dither signal added thereto.

Example 12 is a digital to analog converter (DAC) with error measurement, the digital to analog converter comprising: (A) a plurality of DAC cells, comprising: (1) DAC cells driven by data bits corresponding to a digital input and a dither signal added thereto; and (2) a DAC cell under calibration to receive a dither signal with opposite polarity; and (B) an observer analog to digital converter (ADC) to quantize an analog output of the DAC cells resulting from the dither signal with opposite polarity driving the DAC cell under calibration, and to generate a digital output; wherein a duty cycle error of the DAC cell under calibration is extractable from the digital output, a switching bit stream of the dither signal, and a switching count of the switching bit stream.

In Example 13, the DAC of Example 12 can optionally include digital processing circuitry to generate the switching bit stream from the dither signal.

In Example 14, the DAC of Example 12 or 13 can optionally include the switching bit stream representing switching instances in the dither signal.

In Example 15, the DAC of any one of Examples 12-14 can optionally include: digital processing circuitry to determine the switching count by accumulating values of the switching bit stream.

In Example 16, the DAC of any one of Examples 12-15 can optionally include: digital processing circuitry to cross-correlate the switching bit stream and the digital output, and to extract the duty cycle error of the DAC cell under calibration based on (1) a zeroth tap of the cross-correlation of the switching bit stream and the digital output, and (2) the switching count.

In Example 17, the DAC of any one of Examples 12-16 can optionally include: a binary to thermometer decoder to convert the digital input and the dither signal added thereto into the data bits.

In Example 18, the DAC of any one of Examples 12-17 can optionally include: an adder to add the dither signal to the digital input.

In Example 19, the DAC of any one of Examples 12-17 can optionally include: a dither DAC cell to receive the dither signal; a summation node to add the dither signal to an analog input of an analog to digital converter; and the analog to digital converter to generate the digital input having the dither signal added thereto.

In Example 20, the DAC of any one of Examples 12-19 can optionally include: a first multiplexer to output one of: a first bit of the data bits, and the dither signal with opposite polarity; and a second multiplexer to output one of: a second bit of the data bits, and the dither signal with opposite polarity.

In Example 21, the DAC of any one of Examples 12-20 can optionally include: a third multiplexer to output one of: the data bits, and the dither signal with opposite polarity.

In Example 22, the DAC of any one of Examples 12-21 can optionally include: the observer ADC being a voltage-controlled-oscillator analog to digital converter.

In Example 23, the DAC of any one of Examples 12-22 can optionally include: the DAC cell under calibration having a same weight as the dither signal.

In Example 24, the DAC of any one of Examples 12-22 can optionally include: the DAC cell under calibration having a different weight than the dither signal.

In Example 25, the DAC of any one of Examples 12-24 can optionally include: the DAC being a stand-alone DAC.

In Example 26, the DAC of any one of Examples 12-24 can optionally include: the DAC generating an analog signal as part of an analog to digital conversion.

Example 27 is a digital to analog converter (DAC) with error measurement, the digital to analog converter comprising: (A) a decoder to receive a digital input; (B) a plurality of DAC cells, comprising: (1) a DAC cell under calibration to receive the dither signal with opposite polarity; (2) further DAC cells driven by data bits corresponding to the digital input; and (3) a dither DAC cell to receive the dither signal; and (C) an observer analog to digital converter to quantize an analog output of the DAC cells resulting from the dither signal with opposite polarity driving the DAC cell under calibration, and to generate a digital output; wherein a duty cycle error of the DAC cell under calibration is extractable from the digital output, a switching bit stream of the dither signal, and a switching count of the switching bit stream.

In Example 28, the DAC of Example 27 can optionally include: digital processing circuitry to generate the switching bit stream from the dither signal.

In Example 29, the DAC of Example 27 or 28 can optionally include: the switching bit stream represents switching instances in the dither signal.

In Example 30, the DAC of any one of Examples 27-29 can optionally include: digital processing circuitry to determine the switching count by accumulating values of the switching bit stream.

In Example 31, the DAC of any one of Examples 27-30 can optionally include: digital processing circuitry to cross-correlate the switching bit stream and the digital output, and to extract the duty cycle error of the DAC cell under calibration based on (1) a zeroth tap of the cross-correlation of the switching bit stream and the digital output, and (2) the switching count.

In Example 32, the DAC of any one of Examples 27-31 can optionally include the decoder comprising: a first multiplexer to output one of: a first bit of the data bits, and the dither signal with opposite polarity; and a second multiplexer to output one of: a second bit of the data bits and the dither signal with opposite polarity.

In Example 33, the DAC of any one of Examples 27-32 can optionally include the decoder comprising: a third multiplexer to output one of: the data bits, and the dither signal with opposite polarity.

In Example 34, the DAC of any one of Examples 27-33 can optionally include the observer ADC being a voltage-controlled-oscillator analog to digital converter.

Example 35 is a method for extracting errors of a digital to analog converter (DAC), comprising: adding a dither signal to the DAC; cancelling, by a DAC cell in the DAC, the dither signal injected to the DAC; quantizing an output of the DAC and generating a digital output; cross-correlating a switching bit stream of the dither signal with the digital output; and determining the duty cycle error of the DAC cell based on (1) a value of a zeroth tap of the cross-correlation of the switching bit stream and the digital output, and (2) a switching count of the switching bit stream.

In Example 36, the method of Example 35 can optionally include: adding a further dither signal to the DAC; cancelling, by the DAC cell in the DAC, the further dither signal injected to the DAC; quantizing the output of the DAC and generating a further digital output; cross-correlating a further switching bit stream of the further dither signal with the further digital output; and determining the duty cycle error of the DAC cell further based on (3) a value of a zeroth tap of the cross-correlation of further switching bit stream of the further dither signal with the further digital output, and (4) a further switching count of the further switching bit stream, wherein the further switching count is different from the switching count.

In Example 37, the method of Example 35 or 36 can optionally include adding the dither signal the DAC comprising: adding the dither signal to an input of the DAC digitally.

In Example 38, the method of Example 35 or 36 can optionally include adding the dither signal to the DAC comprising: adding the dither signal to an analog input signal of an analog to digital converter; and generating, by the analog to digital converter, an input of the DAC having the dither signal added thereto.

In Example 39, the method of Example 35 or 36 can optionally include adding the dither signal to the DAC comprising: driving a dither DAC cell with the dither signal.

Example 40 is an apparatus comprising means for performing/implementing any one of the methods described herein, such as Examples 1-11, and 35-39.

OTHER IMPLEMENTATION NOTES, VARIATIONS, AND APPLICATIONS

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often RF functions: all of which may be provided on a single chip substrate. Other embodiments may include a multi-chip-module (MCM), with a plurality of separate ICs located within a single electronic package and configured to interact closely with each other through the electronic package. In various other embodiments, the digital filters may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

The background technique for measuring DAC duty cycle error are particularly suitable for high speed, wide bandwidth, high precision applications where the performance of the DAC is critical. Applications which can greatly benefit from the architecture include: instrumentation, testing, spectral analyzers, military purposes, radar, wired or wireless communications, mobile telephones (especially because standards continue to push for higher speed communications), and base stations. These products are employed in wired and wireless communications, instrumentation, radar, electronic warfare, and other applications.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to the background measurement technique, such as the processes shown in FIGS. 14-15, illustrate only some of the possible functions that may be executed by, or within, the systems illustrated in FIGS. 3-6. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of the apparatus described above may also be implemented with respect to the method or process described herein and specifics in the examples may be used anywhere in one or more embodiments.

What is claimed is:

1. A method for extracting errors of a digital to analog converter (DAC) having a decoder and a plurality of DAC cells driven by outputs of the decoder, the method comprising:
    receiving, by the decoder, a digital input having a first dither signal added thereto;
    driving a first DAC cell by the first dither signal with opposite polarity;
    generating a first digital output by digitizing a first analog output of the DAC resulting from the first dither signal with opposite polarity driving the first DAC cell;
    generate a first switching bit stream based on the first dither signal, wherein the first switching bit stream has values that represent switching activity of the first dither signal;
    cross-correlating the first switching bit stream and the first digital output; and
    extracting a first duty cycle error of the first DAC cell based on the cross-correlation of the first switching bit stream and the first digital output.

2. The method of claim 1, wherein:
    the first switching bit stream has a value of one to represent the first dither signal transitioning states; and
    the first switching bit stream has a value of zero to represent the first dither signal having a same state.

3. The method of claim 1, wherein generating the first switching bit stream comprises:
    applying an exclusive-or operation on a value of the first switching bit stream and a previous value of the first switching bit stream.

4. The method of claim 1, further comprising:
    determining a first switching count from the first switching bit stream;
    wherein extracting the first duty cycle error of the first DAC cell comprises normalizing the first duty cycle error based on the first switching count.

5. The method of claim 4, wherein determining the first switching count from the first switching bit stream comprises accumulating values of the first switching bit stream in a counter.

6. The method of claim 1, wherein extracting the first duty cycle error comprises:
    deriving the first duty cycle error based on a value of a zeroth tap of the cross-correlation of the first switching bit stream and the first digital output.

7. The method of claim 1, further comprising:
    receiving, by the decoder, a second digital input having a second dither signal added thereto;
    driving the first DAC cell by the second dither signal with opposite polarity;
    generating a second digital output by digitizing a second analog output of the DAC resulting from the second dither signal with opposite polarity driving the first DAC cell;
    generating a second switching bit stream based on the second dither signal, wherein the second switching bit stream has a second switching count that is different from a first switching count of the first switching bit stream; and
    cross-correlating the second switching bit stream and the second digital output.

8. The method of claim 7, wherein extracting the first duty cycle error comprises:
   extracting the first duty cycle error of the first DAC cell based on a first value of a zeroth tap of the cross-correlation of the first switching bit stream and the first digital output, and a second value of a zeroth tap of the cross-correlation of the second switching bit stream and the second digital output.

9. The method of claim 1, further comprising:
   receiving, by the decoder, the digital input having a third dither signal added thereto;
   driving a second DAC cell by the third dither signal with opposite polarity;
   generating a third digital output by digitizing a third analog output of the DAC resulting from the third dither signal with opposite polarity driving the second DAC cell;
   generate a third switching bit stream based on the third dither signal;
   cross-correlating the third switching bit stream and the third digital output; and
   extracting a second duty cycle error of the second DAC cell based on the cross-correlation of the third switching bit stream and the third digital output.

10. The method of claim 1, further comprising:
    adding, by the decoder, the first dither signal to the digital input digitally.

11. A digital to analog converter (DAC) with error measurement, the digital to analog converter comprising:
    a plurality of DAC cells, comprising:
       DAC cells driven by data bits corresponding to a digital input and a dither signal added thereto; and
       a DAC cell under calibration to receive a dither signal with opposite polarity; and
    an observer analog to digital converter (ADC) to quantize an analog output of the DAC cells resulting from the dither signal with opposite polarity driving the DAC cell under calibration, and to generate a digital output;
    wherein:
       a duty cycle error of the DAC cell under calibration is extractable from the digital output, a switching bit stream of the dither signal, and a switching count of the switching bit stream; and
       the switching bit stream has values that represent switching activity of the dither signal.

12. The DAC of claim 11, further comprising:
    digital processing circuitry to generate the switching bit stream from the dither signal.

13. The DAC of claim 11, wherein the values of the switching bit stream represent presence or absence of switching activity in the dither signal.

14. The DAC of claim 11, further comprising:
    digital processing circuitry to determine the switching count by accumulating values of the switching bit stream.

15. The DAC of claim 11, further comprising:
    digital processing circuitry to cross-correlate the switching bit stream and the digital output, and to extract the duty cycle error of the DAC cell under calibration based on (1) a zeroth tap of the cross-correlation of the switching bit stream and the digital output, and (2) the switching count.

16. The DAC of claim 11, further comprising:
    a binary to thermometer decoder to convert the digital input and the dither signal added thereto into the data bits.

17. The DAC of claim 11, further comprising:
    an adder to add the dither signal to the digital input.

18. The DAC of claim 11, wherein the observer ADC is a voltage-controlled-oscillator analog to digital converter.

19. A method for extracting errors of a digital to analog converter (DAC), comprising:
    adding a dither signal to the DAC;
    cancelling, by a DAC cell in the DAC, the dither signal injected to the DAC;
    quantizing an output of the DAC and generating a digital output;
    cross-correlating a switching bit stream of the dither signal with the digital output; and
    determining a duty cycle error of the DAC cell based on (1) a value of a zeroth tap of the cross-correlation of the switching bit stream and the digital output, and (2) a switching count of the switching bit stream.

20. The method of claim 19, further comprising:
    adding a further dither signal to the DAC;
    cancelling, by the DAC cell in the DAC, the further dither signal injected to the DAC;
    quantizing the output of the DAC and generating a further digital output;
    cross-correlating a further switching bit stream of the further dither signal with the further digital output; and
    determining the duty cycle error of the DAC cell further based on (3) a value of a zeroth tap of the cross-correlation of further switching bit stream of the further dither signal with the further digital output, and (4) a further switching count of the further switching bit stream, wherein the further switching count is different from the switching count.

21. The method of claim 19, wherein adding the dither signal to the DAC comprises:
    adding the dither signal to an input of the DAC digitally.

22. The method of claim 19, wherein adding the dither signal to the DAC comprises:
    driving a dither DAC cell in the DAC with the dither signal.

23. The DAC of claim 11, further comprising:
    a first multiplexer to output one of: a first bit of the data bits, and the dither signal with opposite polarity; and
    a second multiplexer to output one of: a second bit of the data bits, and the dither signal with opposite polarity.

24. The DAC of claim 11, further comprising:
    a third multiplexer to output one of: the data bits, and the dither signal with opposite polarity.

25. The DAC of claim 11, wherein the DAC cell under calibration has a same weight as the dither signal.

26. The DAC of claim 11, wherein the DAC cell under calibration has a different weight than the dither signal.

27. The DAC of claim 11, wherein the DAC is a stand-alone DAC.

28. The DAC of claim 11, wherein the DAC generates an analog signal as part of an analog to digital conversion.

29. A digital to analog converter (DAC) with error measurement, the digital to analog converter comprising:
    a decoder to receive a digital input;
    a plurality of DAC cells, comprising:
       a dither DAC cell to receive a dither signal;
       a DAC cell under calibration to receive the dither signal with opposite polarity; and
       further DAC cells driven by data bits corresponding to the digital input; and
    an observer analog to digital converter to quantize an analog output of the DAC cells resulting from the dither signal with opposite polarity driving the DAC cell under calibration, and to generate a digital output;

wherein:
a duty cycle error of the DAC cell under calibration is extractable from the digital output, a switching bit stream of the dither signal, and a switching count of the switching bit stream; and
the switching bit stream has values that represent switching instances of the dither signal.

30. The DAC of claim 29, further comprising:
digital processing circuitry to generate the switching bit stream from the dither signal.

31. The DAC of claim 29, further comprising:
digital processing circuitry to determine the switching count by accumulating values of the switching bit stream.

32. The DAC of claim 29, further comprising:
digital processing circuitry to cross-correlate the switching bit stream and the digital output, and to extract the duty cycle error of the DAC cell under calibration based on (1) a zeroth tap of the cross-correlation of the switching bit stream and the digital output, and (2) the switching count.

33. The DAC of claim 29, wherein the decoder comprises:
a first multiplexer to output one of: a first bit of the data bits, and the dither signal with opposite polarity; and
a second multiplexer to output one of: a second bit of the data bits and the dither signal with opposite polarity.

34. The DAC of claim 29, wherein the decoder comprises:
a third multiplexer to output one of: the data bits, and the dither signal with opposite polarity.

35. The DAC of claim 29, wherein the observer ADC is a voltage-controlled-oscillator analog to digital converter.

36. The DAC of claim 29, wherein the DAC cell under calibration has a same weight as the dither signal.

37. The DAC of claim 29, wherein the DAC cell under calibration has a different weight than the dither signal.

38. The DAC of claim 29, wherein the DAC is a stand-alone DAC.

39. The DAC of claim 29, wherein the DAC generates an analog signal as part of an analog to digital conversion.

* * * * *